United States Patent
Jang et al.

(10) Patent No.: US 11,195,862 B2
(45) Date of Patent: Dec. 7, 2021

(54) THIN FILM TRANSISTOR HAVING GATE INSULATING LAYER INCLUDING DIFFERENT TYPES OF INSULATING LAYERS, METHOD OF MANUFACTURING THE SAME, AND DISPLAY DEVICE COMPRISING THE SAME

(71) Applicant: LG Display Co., Ltd., Seoul (KR)

(72) Inventors: Jaeman Jang, Paju-si (KR); InTak Cho, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/517,263

(22) Filed: Jul. 19, 2019

(65) Prior Publication Data
US 2020/0212076 A1  Jul. 2, 2020

(30) Foreign Application Priority Data
Dec. 26, 2018  (KR) .................. 10-2018-0169586

(51) Int. Cl.
*H01L 27/12* (2006.01)
*H01L 51/05* (2006.01)
*H01L 29/51* (2006.01)
*H01L 29/49* (2006.01)

(52) U.S. Cl.
CPC ........ *H01L 27/1237* (2013.01); *H01L 27/127* (2013.01); *H01L 27/1262* (2013.01); *H01L 29/4908* (2013.01); *H01L 29/511* (2013.01); *H01L 29/512* (2013.01); *H01L 51/0516* (2013.01)

(58) Field of Classification Search
CPC .......... H01L 27/1237; H01L 29/42384; H01L 2029/42388; H01L 51/0516; H01L 51/052; H01L 51/0525; H01L 51/0529; H01L 51/0533; H01L 29/51; H01L 29/511; H01L 29/512; H01L 29/515; H01L 29/4908; H01L 51/508
See application file for complete search history.

(56) References Cited

U.S. PATENT DOCUMENTS

2010/0102324 A1*  4/2010  Toguchi ................. B82Y 10/00
                                                        257/66
2018/0350994 A1* 12/2018  Hosaka ............... H01L 29/4908

* cited by examiner

*Primary Examiner* — Thanhha S Pham
(74) *Attorney, Agent, or Firm* — Birch, Stewart, Kolasch & Birch, LLP

(57) ABSTRACT

A thin film transistor includes an active layer on a substrate, a gate electrode configured to be spaced from the active layer and partially overlapped with the active layer, and a gate insulating layer, at least a part of the gate insulating layer being disposed between the active layer and the gate electrode, wherein the gate insulating layer includes a first gate insulating layer between the active layer and the gate electrode, and a second gate insulating layer configured to have a dielectric constant (k) which is different from a dielectric constant of the first gate insulating layer, and disposed in a same layer as the first gate insulating layer, and wherein at least a part of the second gate insulating layer is disposed between the active layer and the gate electrode.

13 Claims, 15 Drawing Sheets

THIN FILM TRANSISTOR HAVING GATE INSULATING LAYER INCLUDING DIFFERENT TYPES OF INSULATING LAYERS, METHOD OF MANUFACTURING THE SAME, AND DISPLAY DEVICE COMPRISING THE SAME

CROSS-REFERENCE TO RELATED APPLICATION

The present application claims priority under U.S.C § 119(a) to Korean Patent Application No. 10-2018-0169586 filed on Dec. 26, 2018, which is hereby incorporated by reference in its entirety.

BACKGROUND

Technical Field

The present disclosure relates to a thin film transistor having a gate insulating layer including different types of insulating layers, a method of manufacturing the same, and a display device comprising the same. In more detail, the present disclosure relates to a thin film transistor having a gate insulating layer including a first gate insulating layer and a second gate insulating layer whose dielectric constant is different from that of the first gate insulating layer, a method of manufacturing the same, and a display device comprising the same.

Description of the Related Art

A thin film transistor can be manufactured on a glass substrate or a plastic substrate, whereby the thin film transistor is widely used as a switching device or a driving device in a display device such as a liquid crystal display device or an organic light emitting device.

According to a material used for an active layer, the thin film transistor can be largely categorized into an amorphous silicon thin film transistor having an active layer of amorphous silicon, a polycrystalline silicon thin film transistor having an active layer of polycrystalline silicon, and an oxide semiconductor thin film transistor having an active layer of oxide semiconductor.

The amorphous silicon is deposited in a short time, and is formed as an active layer, whereby the amorphous silicon thin film transistor (a-Si TFT) has advantages of short manufacturing time and low manufacturing cost. Meanwhile, it has disadvantages of inferior current driving efficiency due to low mobility, and a change of a threshold voltage. Thus, it is difficult to use the amorphous silicon thin film transistor for an active matrix organic light emitting device (AMOLED).

The polycrystalline silicon thin film transistor (poly-Si TFT) can be obtained by depositing amorphous silicon and crystallizing the deposited amorphous silicon. The polycrystalline silicon thin film transistor has advantages of high electron mobility and great stability, realization of thin profile and high resolution, and high power efficiency. The polycrystalline silicon thin film transistor can include a low temperature poly silicon (LTPS) thin film transistor, and a polysilicon thin film transistor. However, a process of manufacturing the polycrystalline silicon thin film transistor inevitably needs a step of crystallizing the amorphous silicon, whereby a manufacturing cost is increased due to the increased number of manufacturing steps. Also, it has a disadvantage of crystallization at a high temperature. Thus, it is difficult to apply the polycrystalline silicon thin film transistor to a large-sized display device.

The oxide semiconductor thin film transistor (Oxide semiconductor TFT), which has high mobility and has a large resistance change in accordance with an oxygen content, is advantageous in that it facilitates to obtain desired properties. Further, an active layer of oxide is formed at a relatively low temperature for a process of manufacturing the oxide semiconductor thin film transistor, whereby it is possible to lower the manufacturing cost. Furthermore, due to the properties of oxide, an oxide semiconductor is transparent, whereby it is favorable to the realization of a transparent display device.

Recently, with an advancement of high resolution or high pixel density in a mobile display device, lots of pixels are arranged in a small area, whereby a thin film transistor is decreased in size, and a channel length is also shortened. In addition, in order to use a thin film transistor as a driving transistor of a display device, it is necessary to increase an s-factor of the thin film transistor. Accordingly, if the oxide semiconductor thin film transistor has the short channel length or the large s-factor, the oxide semiconductor thin film transistor can be used as a thin film transistor of a display device.

BRIEF SUMMARY

The present disclosure has been made in view of the above and other problems and limitations associated with the related art.

It is an object of the present disclosure to provide a thin film transistor having a gate insulating layer including different types of insulating layers with the different dielectric constants (k).

It is another object of the present disclosure to provide a thin film transistor having a small area due to a short channel obtained by improving a gate insulating layer.

It is another object of the present disclosure to provide a thin film transistor having a large s-factor capable of being used as a driving transistor of a display device.

It is another object of the present disclosure to provide a thin film transistor having improved stability and reliability.

It is another object of the present disclosure to provide a display device comprising the above thin film transistor.

It is a further object of the present disclosure to provide a method of manufacturing the above thin film transistor.

In accordance with an aspect of the present disclosure, the above and other objects can be accomplished by the provision of a thin film transistor comprising an active layer on a substrate, a gate electrode configured to be spaced from the active layer and partially overlapped with the active layer, and a gate insulating layer, at least a part of the gate insulating layer being disposed between the active layer and the gate electrode, wherein the gate insulating layer includes a first gate insulating layer between the active layer and the gate electrode, and a second gate insulating layer configured to have a dielectric constant (k) which is different from that of the first gate insulating layer, disposed in the same layer as the first gate insulating layer, wherein at least a part of the second gate insulating layer is disposed between the active layer and the gate electrode.

A lateral surface of the first gate insulating layer can be in contact with a lateral surface of the second gate insulating layer.

The first gate insulating layer can be disposed inside an area defined by the gate electrode on the plan view. For example, from a top plan view, the second gate insulating layer completely surrounds the first gate insulating layer.

At least a part of the second gate insulating layer can extend to a lateral surface and an upper surface of the gate electrode.

The second gate insulating layer can have the dielectric constant (k) which is higher than that of the first gate insulating layer.

The second gate insulating layer can include at least one among hafnium oxide ($HfO_2$), zirconium oxide ($ZrO_2$), aluminum oxide ($Al_2O_3$), silicon nitride (SiNx), and titanium oxide ($TiO_2$).

The second gate insulating layer can have the dielectric constant (k) which is lower than that of the first gate insulating layer.

The second gate insulating layer can include at least one of strontium oxide ($SrO_2$) and lanthanum oxide ($La_2O_3$).

The active layer can include a first oxide semiconductor layer, and a second oxide semiconductor layer on the first oxide semiconductor layer.

In accordance with another aspect of the present disclosure, there is provided a display device comprising at least one pixel driving circuit on a substrate, and a display element connected with each of the at least one pixel driving circuit, wherein each pixel driving circuit includes a thin film transistor, wherein each thin film transistor includes an active layer on the substrate, a gate electrode configured to be spaced from the active layer and partially overlapped with the active layer, and a gate insulating layer, at least a part of the gate insulating layer being disposed between the active layer and the gate electrode, wherein the gate insulating layer includes a first gate insulating layer between the active layer and the gate electrode, and a second gate insulating layer configured to have a dielectric constant (k) which is different from that of the first gate insulating layer, disposed in the same layer as the first fate insulating layer, and provided to surround the first gate insulating layer, wherein at least a part of the second gate insulating layer is disposed between the active layer and the gate electrode.

At least a part of the second gate insulating layer can extend to a lateral surface and an upper surface of the gate electrode.

The second gate insulating layer can have the dielectric constant (k) which is higher than that of the first gate insulating layer.

The second gate insulating layer can have the dielectric constant (k) which is lower than that of the first gate insulating layer.

In accordance with another aspect of the present disclosure, there is provided a method of manufacturing a thin film transistor comprising forming an active layer on a substrate, sequentially depositing a first gate insulating material layer and a gate electrode material layer on the active layer, forming a first gate insulating layer pattern and a gate electrode by etching the first gate insulating material layer and the gate electrode material layer, forming a first gate insulating layer by etching the first gate insulating layer pattern, and forming a second gate insulating layer on the gate electrode and on a layer in which is the same layer as the first gate insulating layer, wherein the second gate insulating layer has a dielectric constant (k) which is different from that of the first gate insulating layer, and at least a part of the second gate insulating layer is provided between the active layer and the gate electrode.

The second gate insulating layer can be formed by a metal organic chemical vapor deposition (MOCVD).

The second gate insulating layer can extend to a lateral surface and an upper surface of the gate electrode.

The second gate insulating layer can have the dielectric constant (k) which is higher than that of the first gate insulating layer.

The second gate insulating layer can have the dielectric constant (k) which is lower than that of the first gate insulating layer.

According to one embodiment of the present disclosure, the thin film transistor includes the gate insulating layer comprising the different types of insulating layers with the different dielectric constants (k). If any one of the different-type insulating layers constituting the gate insulating layer has the high dielectric constant (high-k), mobility of the active layer is increased so that it is possible to provide the thin film transistor having a short channel. Also, if any one of the different-type insulating layers constituting the gate insulating layer has the low dielectric constant (low-k), the s-factor of the thin film transistor is increased. Thus, the grayscale expression becomes easier when this thin film transistor is used for the driving transistor of the display device.

According to another embodiment of the present disclosure, any one of the different-type insulating layers constituting the gate insulating layer can extend to the upper surface of the gate electrode. Accordingly, it is possible to prevent defects such as seam in the insulating interlayer between the gate electrode and the source electrode or between the gate electrode and the drain electrode, to thereby improve the insulating properties for the gate electrode. As a result, it is possible to prevent breakdown of insulation between the gate electrode and the source electrode or between the gate electrode and the drain electrode, thereby improving stability and reliability of the thin film transistor.

According to another embodiment of the present disclosure, when the thin film transistor is used, it is possible to decrease the size of the thin film transistor whereby enabling high resolution of the display device, facilitate grayscale expression of the display device, and reduce defects of the display device.

Also, according to another embodiment of the present disclosure, it is possible to manufacture the thin film transistor having the gate insulating layer comprising the different-type insulating layers without addition of a mask process.

In addition to the effects of the present disclosure as mentioned above, additional advantages and features of the present disclosure will be clearly understood by those skilled in the art from the description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
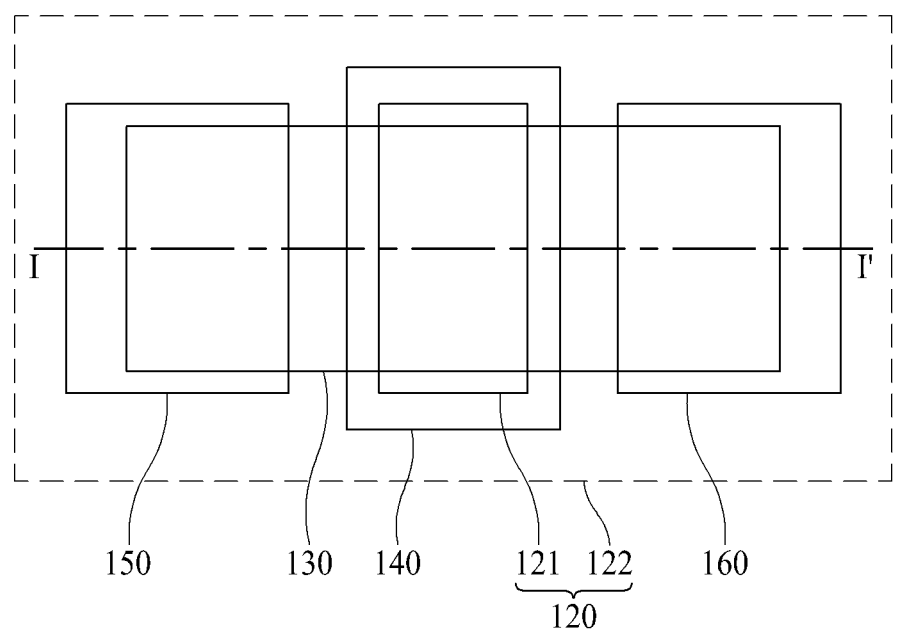
FIG. 1 is a plan view illustrating a thin film transistor according to one embodiment of the present disclosure.

Advantages and features of the present disclosure, and implementation methods thereof will be clarified through the following embodiments, described with reference to the accompanying drawings. The present disclosure can, however, be embodied in different forms is and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the certain points of the present disclosure, the detailed description will be omitted or will be brief.

In the case in which "comprise," "have," and "include" described in the present specification are used, another part can also be present unless "only" is used. The terms in a singular form can include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween can be included, unless "just" or "direct" is used. If it is mentioned that a first element is positioned "on" a second element, it does not mean that the first element is essentially positioned above the second element in the figure. The upper part and the lower part of an object concerned can be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous can be included, unless "just" or "direct" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "direction" can be meant to include one or more directions having wider directivities within the range within which the components of the present disclosure can operate functionally.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode can be the drain electrode, and the drain electrode can be the source electrode. Also, the source electrode in any one embodiment of the present disclosure can be the drain electrode in another embodiment of the present disclosure, and the drain electrode in any one embodiment of the present disclosure can be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region can be a source electrode, and a drain region can be a drain electrode. Also, a source region can be a drain electrode, and a drain region can be a source electrode.

Figure 2:
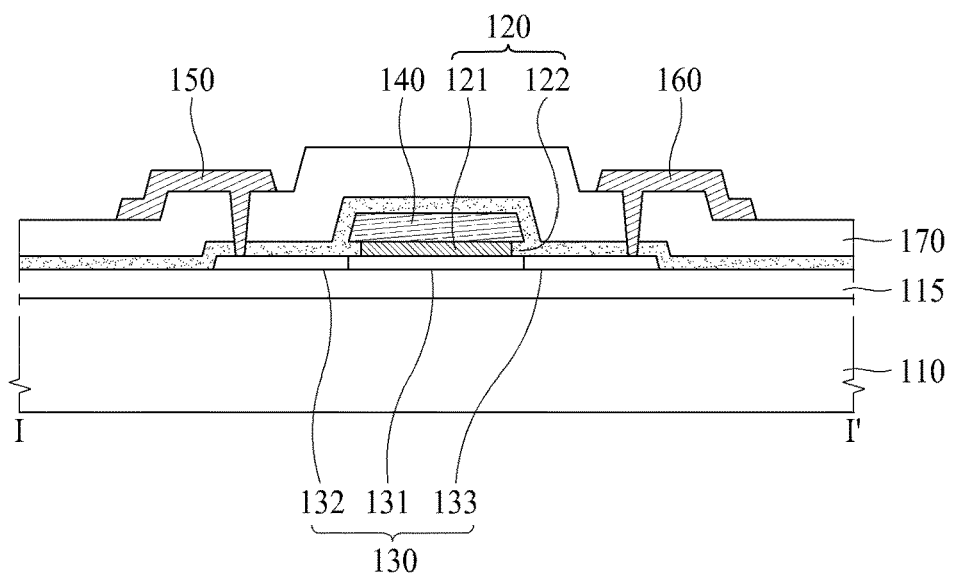
FIG. 2 is a cross sectional view along of FIG. 1.

FIG. 1 is a plan view illustrating a thin film transistor 100 according to one embodiment of the present disclosure, and FIG. 2 is a cross sectional view along I-I' of FIG. 1. All the components of the thin transistor according to all embodiments of the present disclosure are operatively coupled and configured.

The thin film transistor 100 according to one embodiment of the present disclosure includes an active layer 130, a gate insulating layer 120, and a gate electrode 140. The gate electrode 140 is configured to be spaced from the active layer 130, and is partially overlapped with the active layer 130. At least a part of the gate insulating layer 120 can be disposed between the active layer 130 and the gate insulating layer 120.

Referring to FIG. 1, the active layer 130 is disposed on a substrate 110.

The substrate 110 can be formed of glass or plastic. For example, the substrate 110 can be formed of a transparent plastic material having flexibility, for example, polyimide.

A buffer layer 115 can be disposed on the substrate 110. The buffer layer 115 can include at least one of silicon oxide and silicon nitride. The buffer layer 115 can be formed in a single-layered structure, or a multi-layered structure having at least two layers. The buffer layer 115 can have the good insulating properties and good planarization properties, and the buffer layer 115 can protect the active layer 130. The buffer layer 115 can be omitted.

According to one embodiment of the present disclosure, the active layer 130 can be an oxide semiconductor layer made of an oxide semiconductor material.

For example, the active layer 130 can include at least one among IZO(InZnO)-based oxide semiconductor, IGO(In-GaO)-based oxide semiconductor, ITO(InSnO)-based oxide semiconductor, IGZO(InGaZnO)-based oxide semiconductor, IGZTO(InGaZnSnO)-based oxide semiconductor, ITZO (InSnZnO)-based oxide semiconductor, IGTO(InGaSnO)-based oxide semiconductor, GO(GaO)-based oxide semiconductor, GZTO(GaZnSnO)-based oxide semiconductor, and GZO(GaZnO)-based oxide semiconductor. However, one embodiment of the present disclosure is not limited to the above. The active layer 130 can be formed of other oxide semiconductor materials generally known to those in the art.

The active layer 130 can include a channel portion 131 overlapped with the gate electrode 140, and conducting portions 132 and 133 configured to be spaced from each other with respect to the channel portion 131 interposed in-between. The conducting portions 132 and 133 can be obtained by a selective conductorizing process for the oxide semiconductor layer. For example, the conducting portions 132 and 133 can be obtained by treating other areas of the oxide semiconductor layer except the channel portion 131 with a plasma treatment or hydrogen treatment.

The first conducting portion 132 positioned at one side of the channel portion 131 is connected with a source electrode 150. Thus, the first conducting portion 132 can be referred to as a source region.

The second conducting portion 133 positioned at the other side of the channel portion 131 is connected with a drain electrode 160. Thus, the second conducting portion 133 can be referred to as a drain region.

In one embodiment of the present disclosure, for convenience of explanation, the source region and the source electrode are distinguished from each other, and the drain region and the drain electrode are distinguished from each other. However, the embodiments of the present disclosure are not limited to the above. The source region can be the source electrode, and the drain region can be the drain electrode. For example, the source region can be a part of the source electrode along with the source electrode 150, and the drain region can be a part of the drain electrode along with the drain electrode 160. Also, the source region can be the drain electrode, and the drain region can be the source electrode.

Thus, according to one embodiment of the present disclosure, the first conducting portion 132 can be the source electrode, and the second conducting portion 133 can be the drain electrode. Also, the first conducting portion 132 can be the drain electrode, and the second conducting portion 133 can be the source electrode.

A first gate insulating layer 121 is disposed on the active layer 130.

The first gate insulating layer 121 is formed of a material having insulating properties. For example, the first gate insulating layer 121 can be formed of silicon oxide such as SiO2. In this case, the first gate insulating layer 121 can have a dielectric constant (k) of 3.9~4.3. Silicon oxide (SiO2) is used for a general gate insulating layer, which is a verified material having good process stability and good structural stability. Thus, if the first gate insulating layer 121 is formed of silicon oxide (SiO2), the gate insulating layer 120 can have good structural stability.

A method of forming the first gate insulating layer 121 is not limited to a specific method. The first gate insulating layer 121 can be obtained by methods of forming the first gate insulating layer which are generally known to those in the art. For example, after forming a material layer for the first gate insulating layer 121 by a method of deposition, sputtering and ALD (atomic layer deposition), the first gate insulating layer 121 can obtained by etching the material layer.

Referring to FIG. 2, the gate electrode 140 is disposed on the first gate insulating layer 121. The gate electrode 140 is insulated from the active layer 130, and is partially overlapped with the active layer 130. A part of the active layer 130 overlapped with the gate electrode 140 becomes the channel portion 131, and the first conducting portion 132 and the second conducting portion 133 are respectively disposed at both sides of the channel portion 131.

The gate electrode 140 can include at least one among aluminum-based metal such as aluminum or aluminum alloy, argentums-based metal such as argentums (Ag) or argentums alloy, copper-based metal such as copper (Cu) or copper alloy, molybdenum-based metal such as molybdenum (Mo) or molybdenum alloy, chrome (Cr), tantalum (Ta), neodymium (Nd), and titanium (Ti). The gate electrode 140 can have a multi-layered structure including at least two layers with the different physical properties.

The second gate insulating layer 122 is disposed adjacent to the first gate insulating layer 121. The gate insulating layer 120 is obtained by the first gate insulating layer 121 and the second gate insulating layer 122.

In detail, the gate insulating layer 120 includes the first gate insulating layer 121 and the second gate insulating layer 122. At least a part of the gate insulating layer 120 can be disposed between the active layer 130 and the gate electrode 140.

The first gate insulating layer 121 can be disposed between the active layer 130 and the gate electrode 140. Referring to FIGS. 1 and 2, the first gate insulating layer 121 is disposed inside the area defined by the gate electrode 140 from the plan view. If the gate electrode 140 extends to the other area except to the area overlapped with the active layer 130, the first gate insulating layer 121 can be disposed on the other areas except the area above the active layer 130. Referring to FIGS. 1 and 2, the first gate insulating layer 121 is disposed on the channel portion 131.

The second gate insulating layer 122 has a dielectric constant (k) which is different from that of the first gate insulating layer 121 where k is a number, and the second gate insulating layer 122 can be disposed in the same layer as the first gate insulating layer 121. From the plan view, the second gate insulating layer 122 surrounds the first gate insulating layer 121. Also, referring to FIG. 2, at least a part of the second gate insulating layer 122 can be disposed between the active layer 130 and the gate electrode 140. In detail, at least a part of the second gate insulating layer 122 can be disposed on the channel portion 131 between the active layer 130 and the gate electrode 140. Thus, according to one embodiment of the present disclosure, the active layer 130 includes the channel portion 131 overlapped with the gate electrode 140, and at least a part of the first gate insulating layer 121 and at least a part of the second gate insulating layer 122 can be disposed on the channel portion 131.

According to one embodiment of the present disclosure, a lateral surface of the first gate insulating layer 121 is in contact with a lateral surface of the second gate insulating layer 122. Thus, according to one embodiment of the present disclosure, the first gate insulating layer 121 and the second gate insulating layer 122 can be sequentially disposed on the same plane.

According to one embodiment of the present disclosure, the second gate insulating layer 122 can be formed by a metal organic chemical vapor deposition (MOCVD). In more detail, the second gate insulating layer 122 can be an atomic layer deposition method using the metal organic chemical vapor deposition (MOCVD).

If the second gate insulating layer 122 is formed by the metal organic chemical vapor deposition (MOCVD), it is possible to improve uniformity and stability in the second gate insulating layer 122. Also, according as the second gate insulating layer 122 is formed by the metal organic chemical vapor deposition (MOCVD), the second gate insulating layer 122 can be disposed in the edge of the area between the active layer 130 and the gate electrode 140, in which the first gate insulating layer 121 is not disposed. Accordingly, it is possible to realize the good insulating properties in the active layer 130 and the gate electrode 140.

Further, referring to FIG. 2, at least a part of the second gate insulating layer 122 extends onto a lateral surface and an upper surface of the gate electrode 140. According to one embodiment of the present disclosure, among surfaces of the gate electrode 140, the surface facing toward the substrate 110 is referred to as a lower surface, and the surface facing to the opposite side of the substrate 110 is referred to as an upper surface. The surface positioned at a lower side of the drawing becomes a lower surface, the surface positioned at an upper side of the drawing becomes an upper surface, and the surface between the upper surface and the lower surface becomes a lateral surface.

Referring to FIG. 2, the gate electrode 140 can be completely surrounded by the first gate insulating layer 121 and the second gate insulating layer 122.

The second gate insulating layer 122 of the different-type insulating layers constituting the gate insulating layer 120 extends to the upper surface of the gate electrode 140, and protects the gate electrode 140 so that it is possible to prevent defects such as seam in an insulating interlayer 170 between the gate electrode 140 and the source electrode 150 and between the gate electrode 140 and the drain electrode 160. Accordingly it is possible to improve the insulating properties to the gate electrode 140 and to prevent breakdown of insulation between the gate electrode 140 and the source electrode 150 or between the gate electrode 140 and the drain electrode 160, thereby improving stability and reliability of the thin film transistor 100.

According to one embodiment of the present disclosure, the second gate insulating layer 122 has a dielectric constant (k) which is higher than that of the first gate insulating layer 121.

The material having the high dielectric constant (k) is referred to as a "high-k" material. The material having the high dielectric constant (k) has high dielectric permittivity.

According to one embodiment of the present disclosure, if the second gate insulating layer 122 includes the high-k material(s) corresponding to the material(s) having the high dielectric constant (k), the gate insulating layer 120 can have high dielectric permittivity.

The material having the high dielectric permittivity has a high level of enabling a progress of an electric field thereinside. Thus, if the material having the high dielectric constant (k) is used for the gate insulating layer 120, it has a good progress of an electric field to the inside of the gate insulating layer 120, whereby an electric field generated by the gate electrode 140 efficiently approaches the active layer 140. Also, the material having the high dielectric permittivity has a large electric capacity. As a result, if the same gate voltage is applied to both the gate insulating layer using the material having the low dielectric constant and the gate insulating layer using the material having the high dielectric constant, the gate insulating layer 120 using the material having the high dielectric constant (k) is more favorable to the increase of mobility in the active layer 130, in comparison to the gate insulating layer using the material having the low dielectric constant.

Generally, if a channel length of the thin film transistor is shortened, a change of a threshold voltage becomes large. On the assumption that a high voltage is applied to the drain electrode 160, if a channel length becomes short, the active layer 130 is influenced by the drain electrode 160. Owing to the effect of the drain electrode 160, it has the same effect as that of a case of applying an electric field to the active layer 130. Thus, even though a weak voltage is applied to the gate electrode 140, a current flows through the active layer 130. As a result, a threshold voltage of the thin film transistor is shifted.

Meanwhile, if the high-k material having the high dielectric constant (k) is used for the gate insulating layer 120, the gate insulating layer 120 having the high dielectric permittivity prevents the influence of the drain electrode 160 so that it is possible to prevent the threshold voltage of the thin film transistor from being shifted.

Thus, according to one embodiment of the present disclosure, if the high-k material having the high dielectric constant (k) is used for the gate insulating layer 120, the mobility of the active layer 130 is increased, and the shift of the threshold voltage is prevented so that it is possible to provide the thin film transistor 100 having the short channel.

According to one embodiment of the present disclosure, the first gate insulating layer 121 can be formed of silicon oxide ($SiO_2$). Herein, silicon oxide ($SiO_2$) can have a dielectric constant (k) of about 3.9~4.3.

According to one embodiment of the present disclosure, the second gate insulating layer 122 can have a dielectric constant (k) of 5 or more than 5. If the dielectric constant (k) of the second gate insulating layer 122 is less than 5, the mobility of the active layer 130 and the efficiency of preventing the shift of the threshold voltage might not be high. Thus, the second gate insulating layer 122 is formed of a material having a dielectric constant (k) of 5 or more than 5. As a variation, in order to prevent the increase of mobility in the active layer 130 and the shift of the threshold voltage, the second gate insulating layer 122 can be formed of a material having a dielectric constant (k) of 10 or more than 10.

For example, the second gate insulating layer 122 can include at least one among hafnium oxide (HfO2), zirconium oxide (ZrO2), aluminum oxide (Al2O₃), silicon nitride (SiNx), and titanium oxide (TiO2). In detail, the second gate insulating layer 122 can include at least of hafnium oxide (HfO2) and zirconium oxide (ZrO2).

Referring to FIG. 2, the insulating layer 170 is disposed on the gate electrode 140 and the second gate insulating layer 122. The insulating interlayer 170 can be formed of an insulating material. The insulating interlayer 170 can be formed of an organic material, an inorganic material, or a deposition structure obtained by depositing an organic material layer and an inorganic material layer.

The thin film transistor 100 according to one embodiment of the present disclosure can include the source electrode 150 and the drain electrode 160. The source electrode 150 and the drain electrode 160 can be disposed on the insulating interlayer 170. The source electrode 150 and the drain electrode 160 are spaced from each other, and are connected with the active layer 130. Referring to FIG. 2, the source electrode 150 and the drain electrode 160 are respectively connected with the active layer 130 through contact holes provided in the insulating layer 170.

The source electrode 150 and the drain electrode 160 can include at least one among molybdenum (Mo), aluminum (Al), chrome (Cr), aurum (Au), titanium (Ti), nickel (Ni), copper (Cu), and their alloys. Each of the source electrode 150 and the drain electrode 160 can be formed in a single-layered structure including the above metal or its alloy, or can be formed in a multi-layered structure including at least two layers of the above metal or its alloy.

The active layer 130, the gate electrode 140, the source electrode 150, and the drain electrode 160, which are shown in FIGS. 1 and 2, constitute the thin film transistor 100.

However, one embodiment of the present disclosure is not limited to the above. The first conducting portion 132 and the second conducting portion 133, which are formed by carrying out the conducting process in other areas of the active layer 130 except the channel portion 131, can serve as the source electrode and the drain electrode.

The thin film transistor 100 shown in FIGS. 1 and 2 can have the short channel and the good mobility, whereby the thin film transistor 100 shown in FIGS. 1 and 2 can be used as a switching transistor of a display device. Also, the thin film transistor shown in FIGS. 1 and 2 can be used as a transistor for a gate driver provided in a gate in panel (GIP) type on a substrate.

Figure 3:
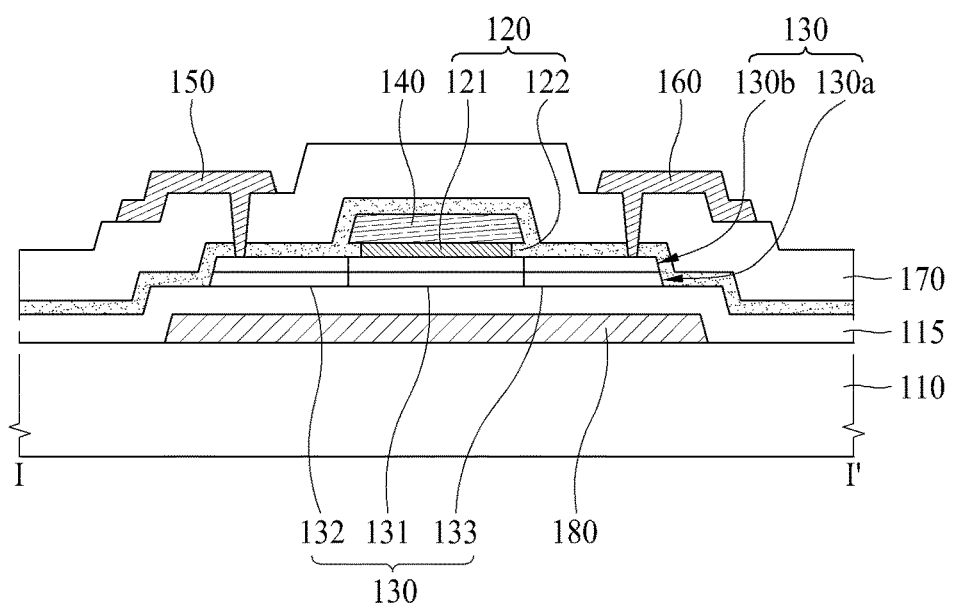
FIG. 3 is a cross sectional view illustrating a thin film transistor according to another embodiment of the present disclosure.

FIG. 3 is a cross sectional view illustrating a thin film transistor 200 according to another embodiment of the present disclosure. Hereinafter, in order to avoid a repetitive explanation, a detailed description for the same parts will be omitted or will be brief.

In comparison to the thin film transistor shown in FIGS. 1 and 2, the thin film transistor 200 shown in FIG. 3 can further include a light shielding layer 180 disposed between a substrate 110 and a buffer layer 115. The light shielding layer 180 is overlapped with an active layer 130.

The light shielding layer 180 blocks light which is incident on the active layer 130 of the thin film transistor 200 from the external, to thereby prevent the active layer 130 from being damaged by the externally-provided light.

The light shielding layer 180 can be foil led of an electrical conductive material such as metal. The buffer layer 115 insulates the light shielding layer 180 from the active layer 130. The light shielding layer 180 can be electrically connected with any one of the source electrode 150 and the drain electrode 160.

Also, referring to FIG. 3, the active layer 130 includes a first oxide semiconductor layer 130a, and a second oxide semiconductor layer 130b on the first oxide semiconductor layer 130a. The first oxide semiconductor layer 130a serves as a supporting layer for supporting the second oxide semiconductor layer 130b, and the second oxide semiconductor layer 130b serves as a channel layer. A channel of the active layer 130 is generally formed in the second oxide semiconductor layer 130b.

The first oxide semiconductor layer 130a serving as the supporting layer has great film stability and good mechanical properties. For the great film stability, the first oxide semiconductor layer 130a can include gallium (Ga), wherein gallium (Ga) forms a stabilized bonding to oxygen, and gallium oxide has good film stability.

For example, the first oxide semiconductor layer 130a can include at least one IGZO(InGaZnO)-based oxide semiconductor material, IGO(InGaO)-based oxide semiconductor material, IGTO(InGaSnO)-based oxide semiconductor material, IGZTO(InGaZnSnO)-based oxide semiconductor material, GZTO(GaZnSnO)-based oxide semiconductor material, GZO(GaZnO)-based oxide semiconductor material, and GO(GaO)-based oxide semiconductor material.

For example, the second oxide semiconductor layer 130b functioning as the channel layer can include at least one among IZO(InZnO)-based oxide semiconductor material, IGO(InGaO)-based oxide semiconductor material, ITO(InSnO)-based oxide semiconductor material, IGZO(InGaZnO)-based oxide semiconductor material, IGZTO(InGaZnSnO)-based oxide semiconductor material, GZTO (GaZnSnO)-based oxide semiconductor material, and ITZO (InSnZnO)-based oxide semiconductor material. However, one embodiment of the present disclosure is not limited to the above. The second oxide semiconductor layer 130b can be formed of other oxide semiconductor materials generally known to those in the art.

The thin film transistor 200 shown in FIG. 3 can have the short channel and the good mobility, whereby the thin film transistor 200 shown in FIG. 3 can be used as a switching transistor of a display device.

Figure 4A:
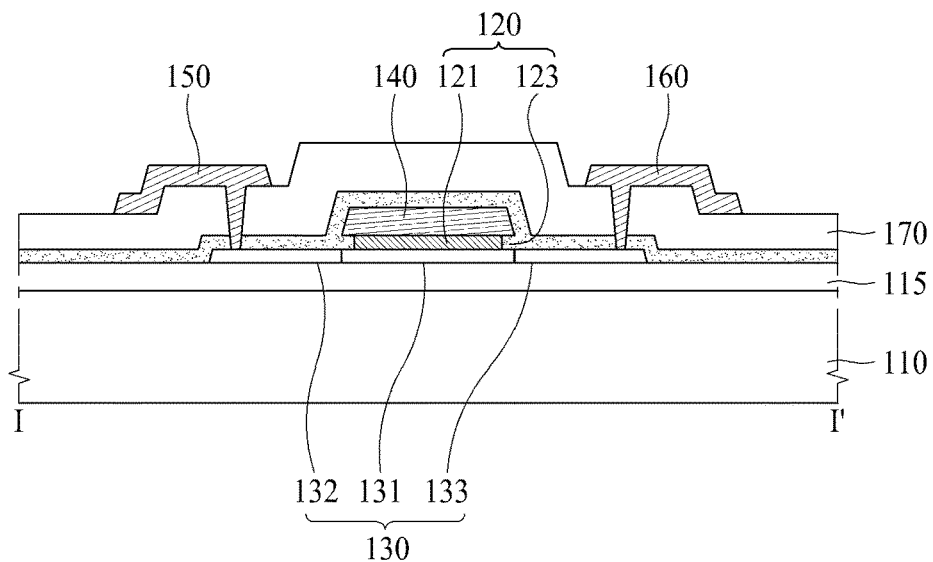
FIG. 4A is a cross sectional view illustrating a thin film transistor according to another embodiment of the present disclosure.

FIG. 4A is a cross sectional view illustrating a thin film transistor 300 according to another embodiment of the present disclosure.

The thin film transistor 300 shown in FIG. 4A includes a gate insulating layer 120, wherein the gate insulating layer 120 includes a first gate insulating layer 121 and a second gate insulating layer 123.

According to this embodiment of the present disclosure, the second gate insulating layer 123 has a dielectric constant (k) which is lower than that of the first gate insulating layer 121.

A material having a low dielectric constant (k) is referred to as a "low-k" material. If a part of the gate insulating layer 120 includes the low-k material, the gate insulating layer 120 can have a low dielectric constant (k).

The material having the low dielectric constant (k) has low dielectric permittivity. The material having the low dielectric permittivity has a low level of enabling a progress of an electric field thereinside. Thus, if the material having the low dielectric constant (k) is used for the gate insulating layer 120, it has an inferior progress of an electric field to the inside of the gate insulating layer 120, whereby an electric field generated by a gate electrode 140 does not efficiently approach the active layer 140. As a result, even though the same voltage is applied thereto, the effect of the electric field to the active layer 130 is low so that it has the same effect as a case of using the thick gate insulating layer 120.

Thus, if the material(s) having the low dielectric constant (k) is/are used for the gate insulating layer 120, a change rate of a drain current to a gate voltage becomes low, whereby an s-factor of the thin film transistor 300 can be increased.

The s-factor can be obtained by a reciprocal number of an inclination in a graph of the drain current to the gate voltage for a threshold voltage (Vth) range of the thin film transistor. If the s-factor becomes large, a change rate of a drain-source current (IDS) to the gate voltage for the threshold voltage (Vth) range becomes smooth, whereby it facilitates to control a level of the drain-source current (IDS) by controlling the gate voltage.

A pixel grayscale can be controlled by controlling the level of the drain-source current (IDS). When it facilitates to control the level of the drain-source current (IDS), it facilitates to control the pixel grayscale.

According to another embodiment of the present disclosure, for example, the second gate insulating layer 123 can have a dielectric constant (k) of 3.5 or less than 3.5.

If the dielectric constant (k) of the second gate insulating layer 123 is more than 3.5, the increase of s-factor might be slight. Thus, according to another embodiment of the present disclosure, the second gate insulating layer 123 can be formed of a material having a dielectric constant (k) of 3.5 or less than 3.5. For example, the second gate insulating layer 123 can include at least one of strontium oxide (SrO2) and lanthanum oxide (La2O3). The second gate insulating layer 123 can have the dielectric constant (k) which is lower than that of the first gate insulating layer 121 and thus, for example, the first gate insulating layer 121 can have a dielectric constant of greater than 3.5.

If the thin film transistor 300 comprising the second gate insulating layer 123 having the low dielectric constant (k) is used as a driving transistor of a display device, it facilitates to express a pixel grayscale.

Figure 4B:
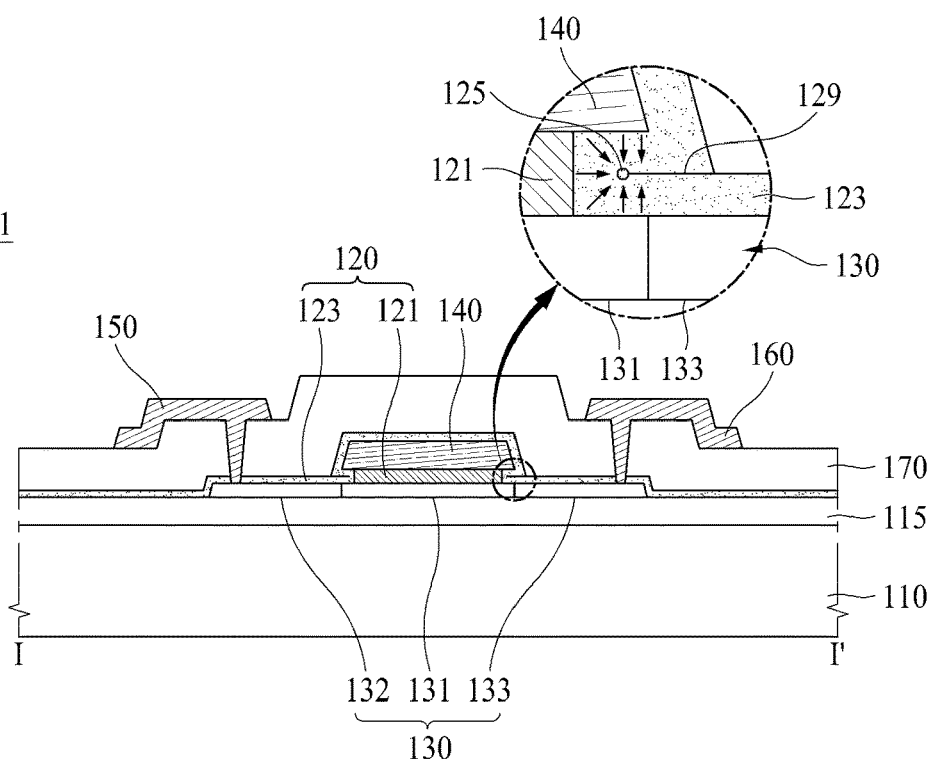
FIG. 4B is a cross sectional view illustrating a thin film transistor according to another embodiment of the present disclosure.

FIG. 4B is a cross sectional view illustrating a thin film transistor 301 according to another embodiment of the present disclosure.

The thin film transistor 301 shown in FIG. 4B includes a gate insulating layer 120, wherein the gate insulating layer 120 includes a first gate insulating layer 121 and a second gate insulating layer 123.

According to this embodiment of the present disclosure, the second gate insulating layer 123 can include one or more pores 125. In detail, the thin film transistor 301 shown in FIG. 4B can include a pore 125 formed in the second gate insulating layer 123. For example, the pore 125 can be formed between the active layer 130 and the gate electrode 140.

According to another embodiment of the present disclosure, the second gate insulating layer 122 can be formed by a metal organic chemical vapor deposition (MOCVD). In the metal organic chemical vapor deposition (MOCVD), vaporized deposition source is disposed on a surface of a target body and then a layer is grows from the surface of the target body. Therefore, referring to FIG. 4B, in the formation of the second gate insulating layer 123, a layer grows from the surfaces of the active layer 130, from a lateral surface of the first gate insulating layer 121 and from a surface of the gate electrode 140, and finally the second gate insulating layer 123 is formed. For reference, arrows of FIG. 4B denote a growth direction of the second gate insulating layer 123.

When a layer grows from an upper surface of the active layer 130, from a lateral surface of the first gate insulating layer 121 and from a lower surface of the gate electrode 140, the pore 125 can be formed between the active layer 130 and the gate electrode 140. As the result, the pore 125 is formed in the second gate insulating layer 123.

The pore 125 can absorb an impact or a shock from outside, and thus, mechanical endurance of the second gate insulating layer 123 can be improved and stability of the thin film transistor 301 can also be improved.

In the growth of the second gate insulating layer 123 by the metal organic chemical vapor deposition (MOCVD), a layer growing from the upper surface of the active layer 130 and a layer growing from the lower surface of the gate electrode 140 can meet each other, and an interface can be formed between the two layers. As the result, an interface 129 can be formed in the second gate insulating layer 123. In detail, the interface 129 can be formed between the active layer 130 and the gate electrode 140.

Figure 5A:
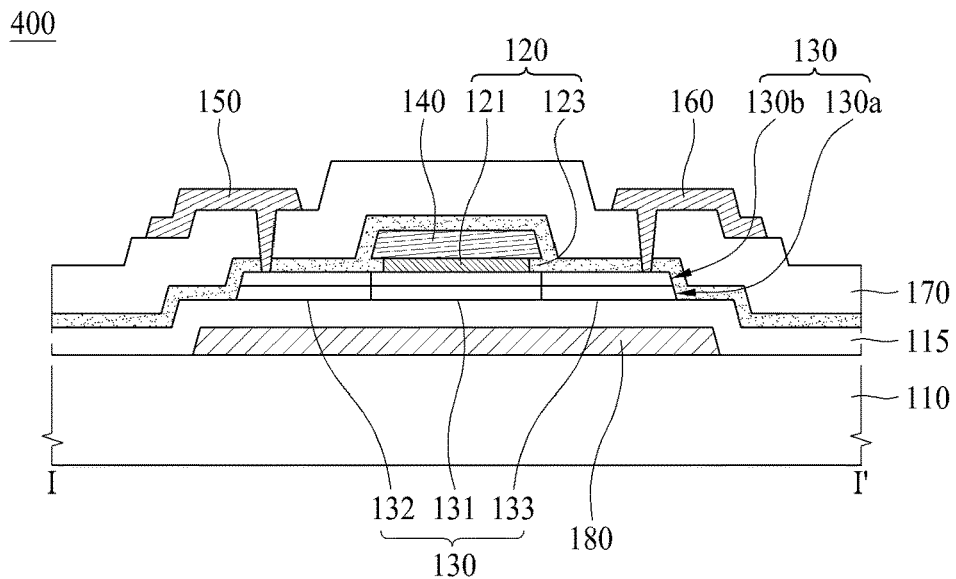
FIG. 5A is a cross sectional view illustrating a thin film transistor according to another embodiment of the present disclosure.

FIG. 5A is a cross sectional view illustrating a thin film transistor 400 according to another embodiment of the present disclosure.

In comparison to the thin film transistor 300 shown in FIG. 4A, the thin film transistor 400 shown in FIG. 5A can further include a light shielding layer 180 disposed between a substrate 110 and a buffer layer 115. The light shielding layer 180 is overlapped with an active layer 130. The light shielding layer 180 blocks light which is incident on the active layer 130 of the thin film transistor 400 from the external, to thereby prevent the active layer 130 from being damaged by the externally-provided light.

Also, referring to FIG. 5A, the active layer 130 includes a first oxide semiconductor layer 130a, and a second oxide semiconductor layer 130b on the first oxide semiconductor layer 130a. The first oxide semiconductor layer 130a serves as a supporting layer for supporting the second oxide semiconductor layer 130b, and the second oxide semiconductor layer 130b serves as a channel layer. A channel of the active layer 130 is generally formed in the second oxide semiconductor layer 130b.

The thin film transistor 400 according to another embodiment of the present disclosure can be used as a driving transistor of a display device.

Figure 5B:
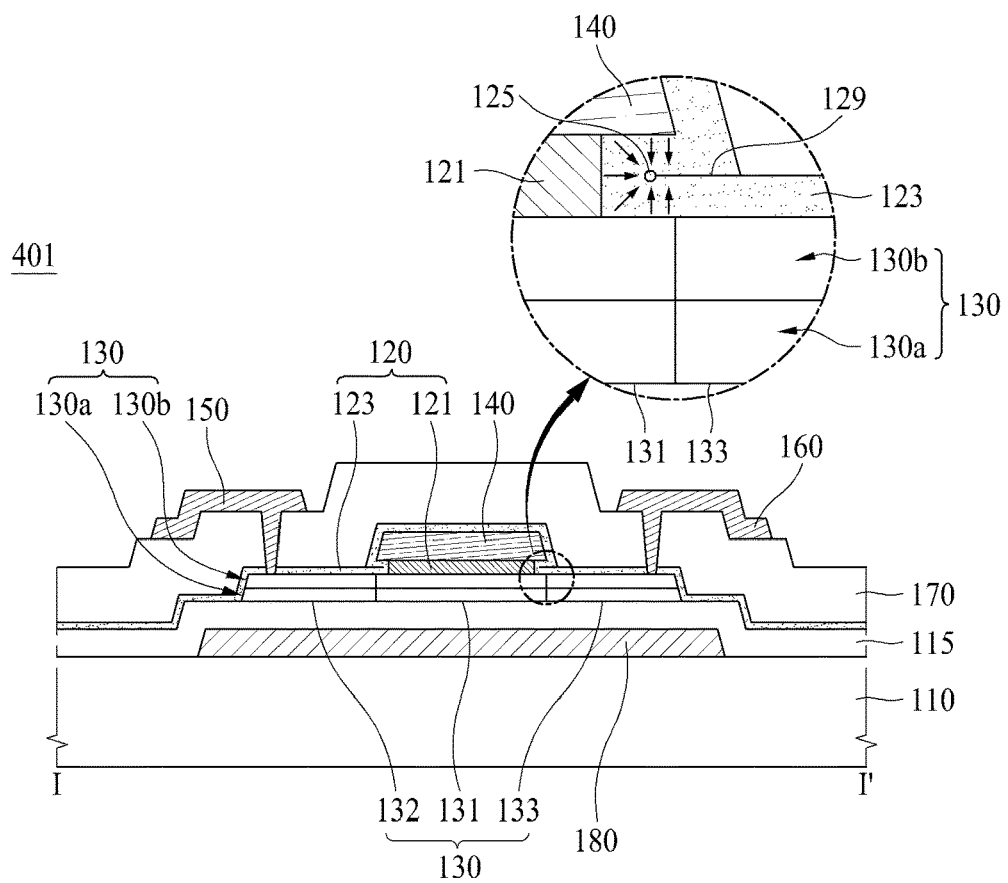
FIG. 5B is a cross sectional view illustrating a thin film transistor according to another embodiment of the present disclosure.

FIG. 5B is a cross sectional view illustrating a thin film transistor 401 according to another embodiment of the present disclosure.

The thin film transistor 401 shown in FIG. 5B includes a gate insulating layer 120, wherein the gate insulating layer 120 includes a first gate insulating layer 121 and a second gate insulating layer 123. The second gate insulating layer 123 can include one or more pores 125. In detail, the thin film transistor 401 shown in FIG. 5B can include a pore 125 formed in second gate insulating layer 123. For example, the pore 125 can be formed between the active layer 130 and the gate electrode 140.

The pore 125 can absorb an impact or a shock from outside, and thus, mechanical endurance of the second gate insulating layer 123 can be improved and stability of the thin film transistor 401 can also be improved.

The second gate insulating layer 123 can include an interface 129. In detail, the interface 129 can be formed between the active layer 130 and the gate electrode 140.

Figure 6:
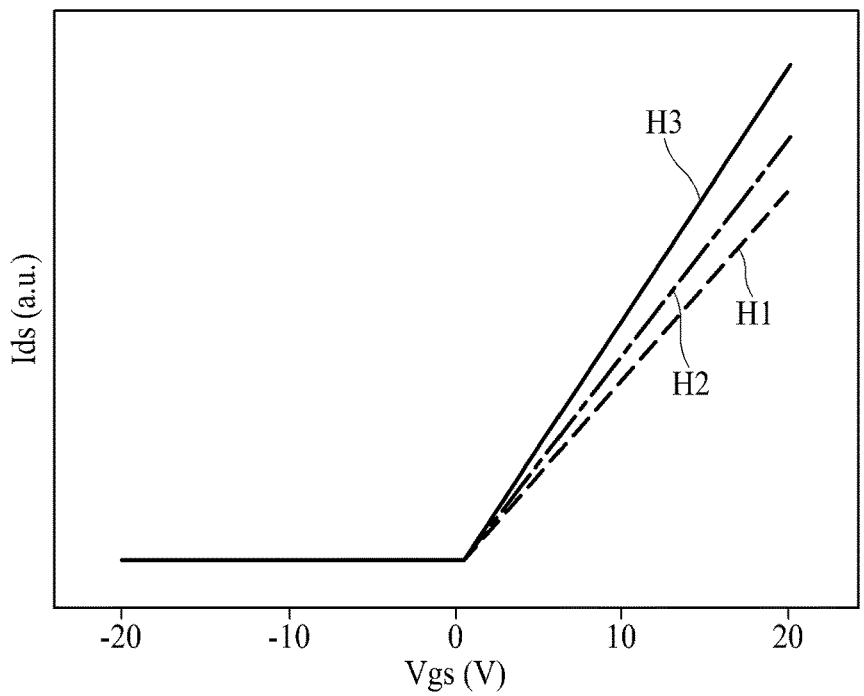
FIG. 6 is a graph illustrating mobility of a thin film transistor according to examples of the present disclosure.

FIG. 6 is a graph illustrating mobility of a thin film transistor according to examples of the present disclosure.

In detail, FIG. 6 is a simulation graph illustrating a source-drain current (Ids) change when a gate voltage (Vgs) is applied to each of a thin film transistor using a gate insulating layer 120 comprising silicon oxide (SiO2) having a dielectric constant (k) of 4.3 (line H1), a thin film transistor using a gate insulating layer 120 comprising silicon nitride (SiNx) having a dielectric constant (k) of about 7 (line H2), and a thin film transistor using a gate insulating layer 120 comprising aluminum oxide (Al2O3) having a dielectric constant of about 10 (line H3). In FIG. 6, a source-drain current (Ids) is expressed as a linear scale, and expressed as an arbitrary unit (a.u.) for a relative comparison.

Referring to FIG. 6, if the gate insulating layer 120 is formed of a material having a high dielectric constant (k), a large current flows through the thin film transistor (see line H3 vs. lines H2 and H1), whereby the thin film transistor has good mobility.

Figure 7:
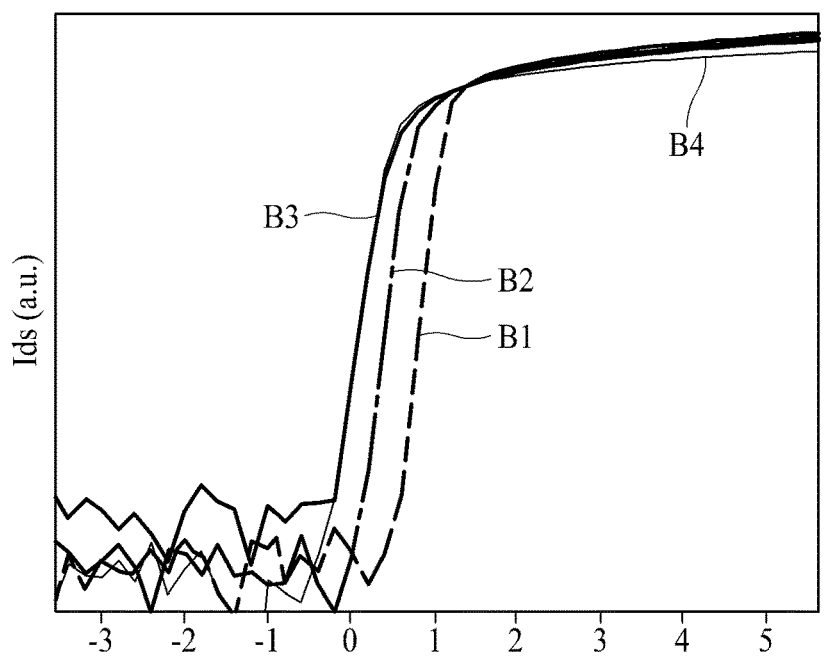
FIG. 7 is a graph illustrating a threshold voltage of a thin film transistor according to examples of the present disclosure.

FIG. 7 is a graph illustrating a threshold voltage of a thin film transistor according to examples of the present disclosure.

In detail, FIG. 7 is a simulation graph illustrating a source-drain current (Ids) change when a gate voltage (Vgg) is applied to each of a thin film transistor using a gate insulating layer 120 comprising a material (line B1) having a dielectric constant (k) of 4, a thin film transistor using a gate insulating layer 120 comprising a material (line B2) having a dielectric constant (k) of 3, a thin film transistor using a gate insulating layer 120 comprising a material (line B3) having a dielectric constant (k) of 2, and a thin film transistor using a gate insulating layer 120 comprising a material (line B1) having a dielectric constant (k) of 1.

Referring to FIG. 7, it can be seen that the change of source-drain current (Ids) for the gate voltage (Vgg) is reduced, and thus, the s-factor of the thin film transistor is increased if the gate insulating layer 120 is formed of the "low-k" material having the low dielectric constant (k).

Hereinafter, a method of manufacturing the thin film transistor 100 according to one embodiment of the present disclosure will be described with reference to FIGS. 8A to 8H. The processes used to faun the thin film transistor 100 can be used in the same or similar manner to form the various transistors (e.g., 200, 300, 301, 400, 401, etc.) according to all embodiments of the present disclosure.

FIGS. 8A to 8H are cross sectional views illustrating a method of manufacturing the thin film transistor 100 according to one embodiment of the present disclosure.

Figure 8A:
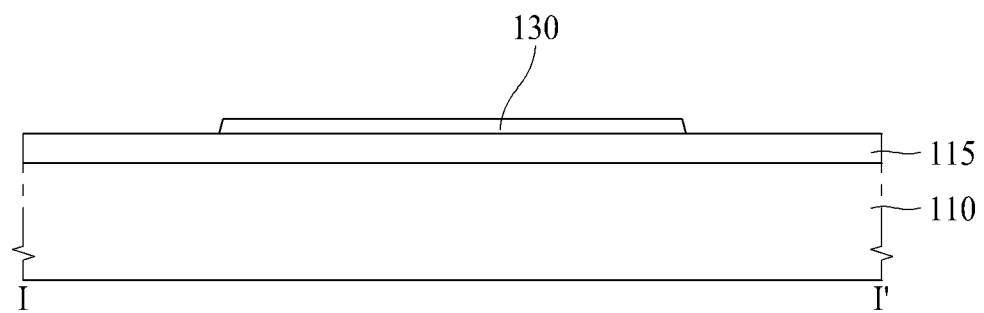
FIGS. 8A to 8H are cross sectional views illustrating a method of manufacturing a thin film transistor according to one embodiment of the present disclosure.

Referring to FIG. 8A, the active layer 130 is formed on the substrate 110. The active layer 130 can be formed of the oxide semiconductor material. Thus, according to one embodiment of the present disclosure, the active layer 130 is the oxide semiconductor layer. The buffer layer 115 can be formed between the substrate 110 and the active layer 130, but can be omitted.

Figure 8B:
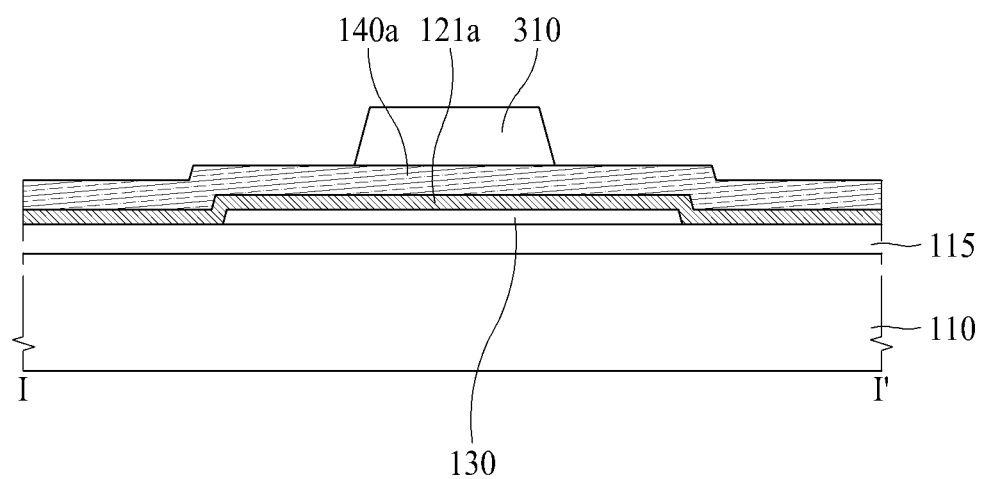

Referring to FIG. 8B, a first gate insulating material layer 121a and a gate electrode material layer 140a are sequentially deposited on the active layer 130.

The first gate insulating material layer 121a becomes the first gate insulating layer 121. The first gate insulating material layer 121a can be formed of silicon oxide or silicon nitride.

The gate electrode material layer 140a becomes the gate electrode 140. The gate electrode material layer 140a can be formed of gate electrode materials generally known to those in the art.

A photoresist pattern 310 is formed on the first gate insulating material layer 121a and the gate electrode material layer 140a. For example, after a photoresist layer is provided on the gate electrode material layer 140a, the photoresist layer is exposed to the light by a light irradiation using a pattern mask, and the exposed photoresist layer is developed, to thereby form the photoresist pattern 310.

The photoresist pattern 310 can be disposed at the position to be provided with the gate electrode 140.

Figure 8C:
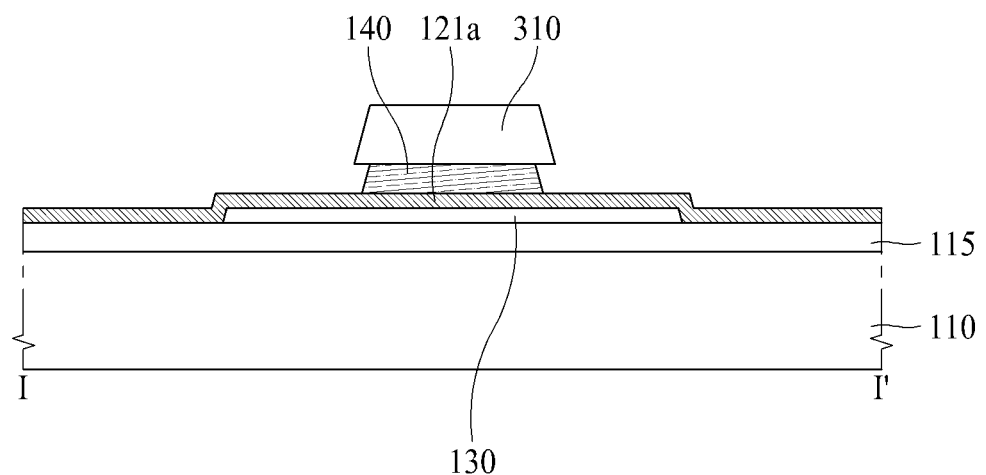

Referring to FIG. 8C, the gate electrode material layer 140a is etched by an etching process using the photoresist pattern 310 as a mask, to thereby form the gate electrode 140. A wet etching or dry etching method can be applied so as to form the gate electrode 140. According to one embodiment of the present disclosure, the wet etching method can be applied thereto.

Figure 8D:
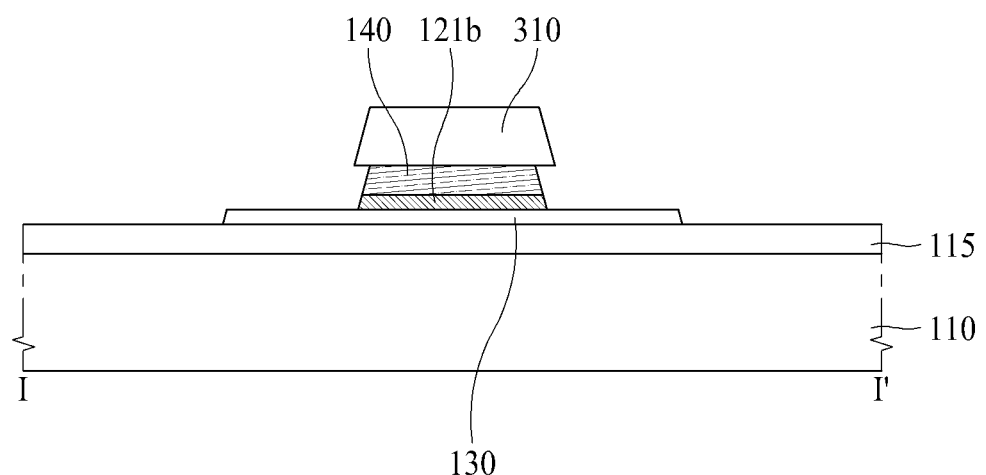

Referring to FIG. 8D, the first gate insulating material layer 121a is etched so that a first gate insulating layer pattern 121b is formed. For an etching process of the first gate insulating material layer 121a, the gate electrode 140 and the photoresist pattern 310 can be used as a mask.

For the etching process of the first gate insulating material layer 121a, a dry etching method or wet etching method can be applied. According to one embodiment of the present disclosure, the dry etching method can be applied.

As a result, the first gate insulating layer pattern 121b is formed on the active layer 130, and the gate electrode 140 is formed on the first gate insulating layer pattern 121b.

Figure 8E:
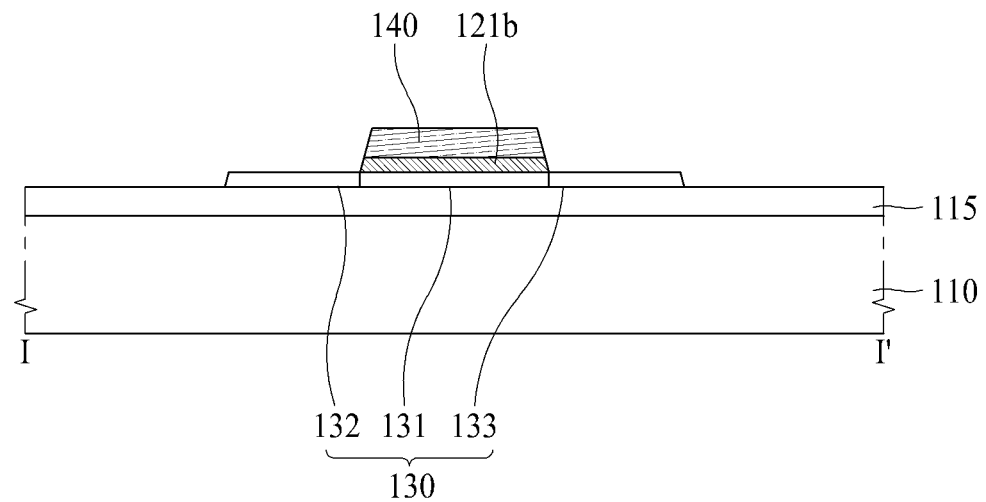

Referring to FIG. 8E, the photoresist pattern 310 is removed. The photoresist pattern 310 can be removed by an ashing process. In this case, the channel portion 131 is formed in the active layer 130. The channel portion 131 is formed in a part of the active layer 130 overlapped with the gate electrode 140.

Figure 8F:
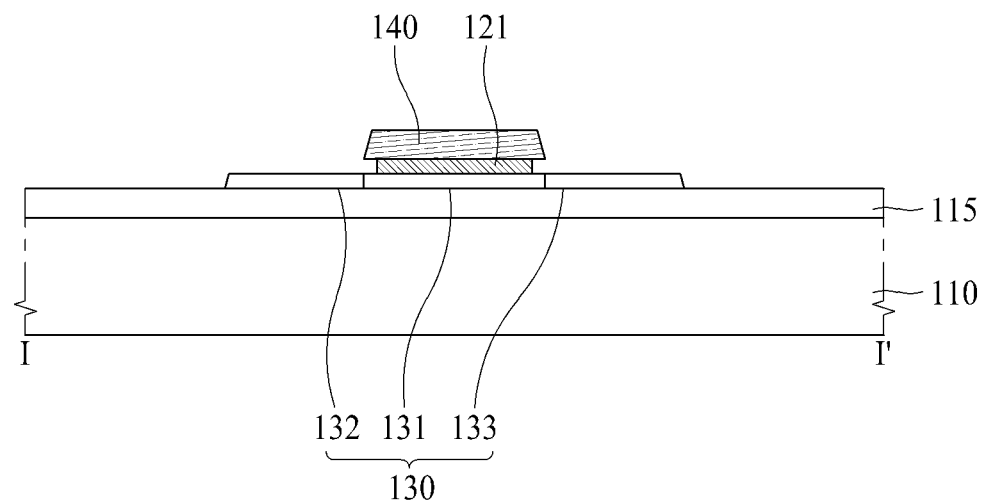

Referring to FIG. 8F, the first gate insulating layer 121 is formed by etching the first gate insulating layer pattern 121b. For etching the first gate insulating layer pattern 121b, a dry etching method or wet etching method can be applied. According to one embodiment of the present disclosure, the wet etching method can be applied.

The first gate insulating layer 121 formed by etching the first gate insulating layer pattern 121b can have a size which is smaller than that of the gate electrode 140, and can be disposed inside the area defined by the gate electrode 140 from the plan view. Referring to FIG. 8F, the first gate insulating layer 121 is disposed on the channel portion 131.

Figure 8G:
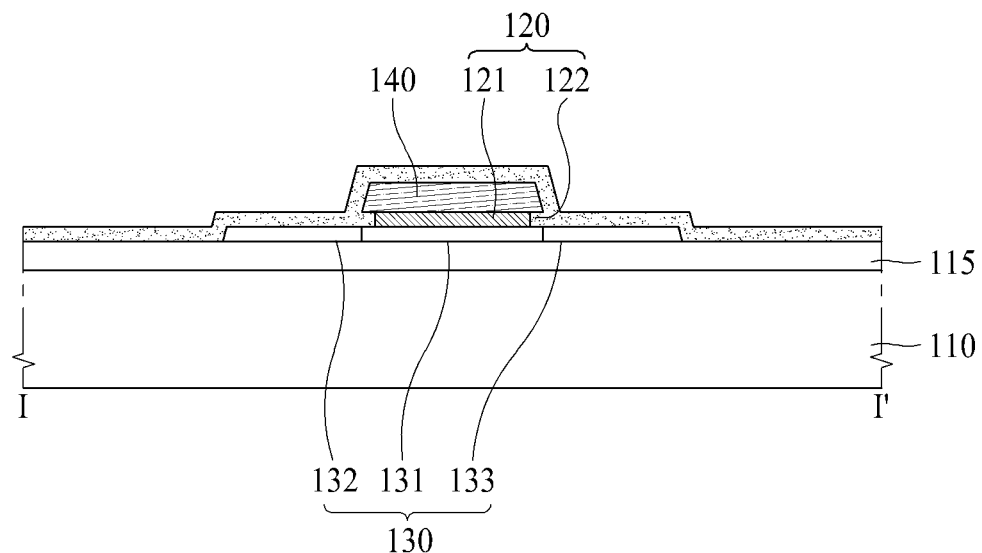

Referring to FIG. 8G, the second gate insulating layer 122 is formed above an entire upper surface of the substrate 110.

In detail, the second gate insulating layer 122 can be provided above the gate electrode 140 and can be provided in the same layer as the first gate insulating layer 121. Thus, at least a part of the second gate insulating layer 122 can be formed in the same layer as the first gate insulating layer 121, and can provided in a shape surrounded by the first gate insulating layer 122 in an aspect of a plane view.

According to one embodiment of the present disclosure, the second gate insulating layer 122 can be formed by a metal organic chemical vapor deposition (MOCVD). As a result, it is possible to form the second gate insulating layer 122 having good uniformity and good stability.

Also, a material for forming the second gate insulating layer 122 can be filled in the edge of the area between the active layer 130 and the gate electrode 140, in which the first gate insulating layer 121 is not provided. As a result, the second gate insulating layer 122 can be disposed in the edge of the area between the active layer 130 and the gate electrode 140 in which the first gate insulating layer 21 is not provided.

Accordingly, at least a part of the second gate insulating layer 122 can be provided between the active layer 130 and the gate electrode 140, and a lateral surface of the second gate insulating layer 122 can be in contact with a lateral surface of the first gate insulating layer 121. As a result, the first gate insulating layer 121 and the second gate insulating layer 122 can be sequentially disposed on the same plane. Referring to FIG. 8G, at least a part of the second gate insulating layer 122 can be disposed on the channel portion 131 between the active layer 130 and the gate electrode 140.

Also, referring to FIG. 8G, in the step of forming the second gate insulating layer 122, the second gate insulating layer 122 can extend to a lateral surface and an upper surface of the gate electrode 140. The gate electrode 140 can be completely surrounded by the first gate insulating layer 121 and the second gate insulating layer 122.

According to one embodiment of the present disclosure, the second gate insulating layer 122 can have the dielectric constant (k) which is different from that of the first gate insulating layer 121.

For example, the second gate insulating layer 122 can have the dielectric constant (k) which is higher than that of the first gate insulating layer 121. In this case, mobility of the active layer 130 is improved, and it is possible to prevent the shift of threshold voltage even though the thin film transistor 100 has the short channel.

However, the manufacturing method according to one embodiment of the present disclosure is not limited to the above, and the second gate insulating layer 122 can be formed of the material having the relatively low dielectric constant (k) than that of the first gate insulating layer 121. In this case, the s-factor of the thin film transistor 100 is increased, whereby it can be used as a driving transistor of a display device.

Figure 8H:
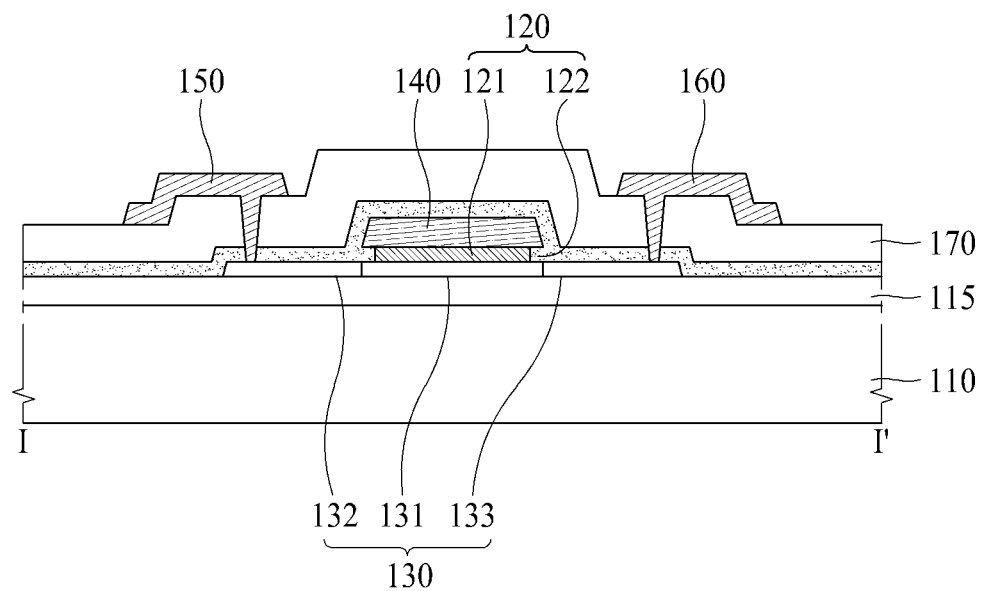

Referring to FIG. 8H, the insulating interlayer 170 is formed on the second gate insulating layer 122, and the source electrode 150 and the drain electrode 160 are formed on the insulating interlayer 170 with contact holes for electrically connecting the source and drain electrodes 150 and 160 to the conducting portions 132 and 133, to thereby complete the thin film transistor 100.

Hereinafter, a display device 500 according to an embodiment of the present disclosure will be described with reference to FIGS. 9 to 12. All the components of the display device according to all embodiments of the present disclosure are operatively coupled and configured.

The display device 500 according to this embodiment of the present disclosure can include a substrate 110, one or more pixel driving circuits (PDCs) on the substrate 110, and a display element 710 connected with the corresponding pixel driving circuit (PDC). The pixel driving circuit (PDC) includes one or more thin film transistors.

Each of the thin film transistors 100, 200, 300, 301, 400 and 401 shown in FIGS. 2, 3, 4A, 4B, 5A and 5B and any of the variations thereof can be used for the one or more thin film transistors included in each PDC. Thus, in order to avoid a repetitive explanation, a detailed description for the thin film transistors 100, 200, 300, 301, 400 and 401 may be omitted.

Figure 9:
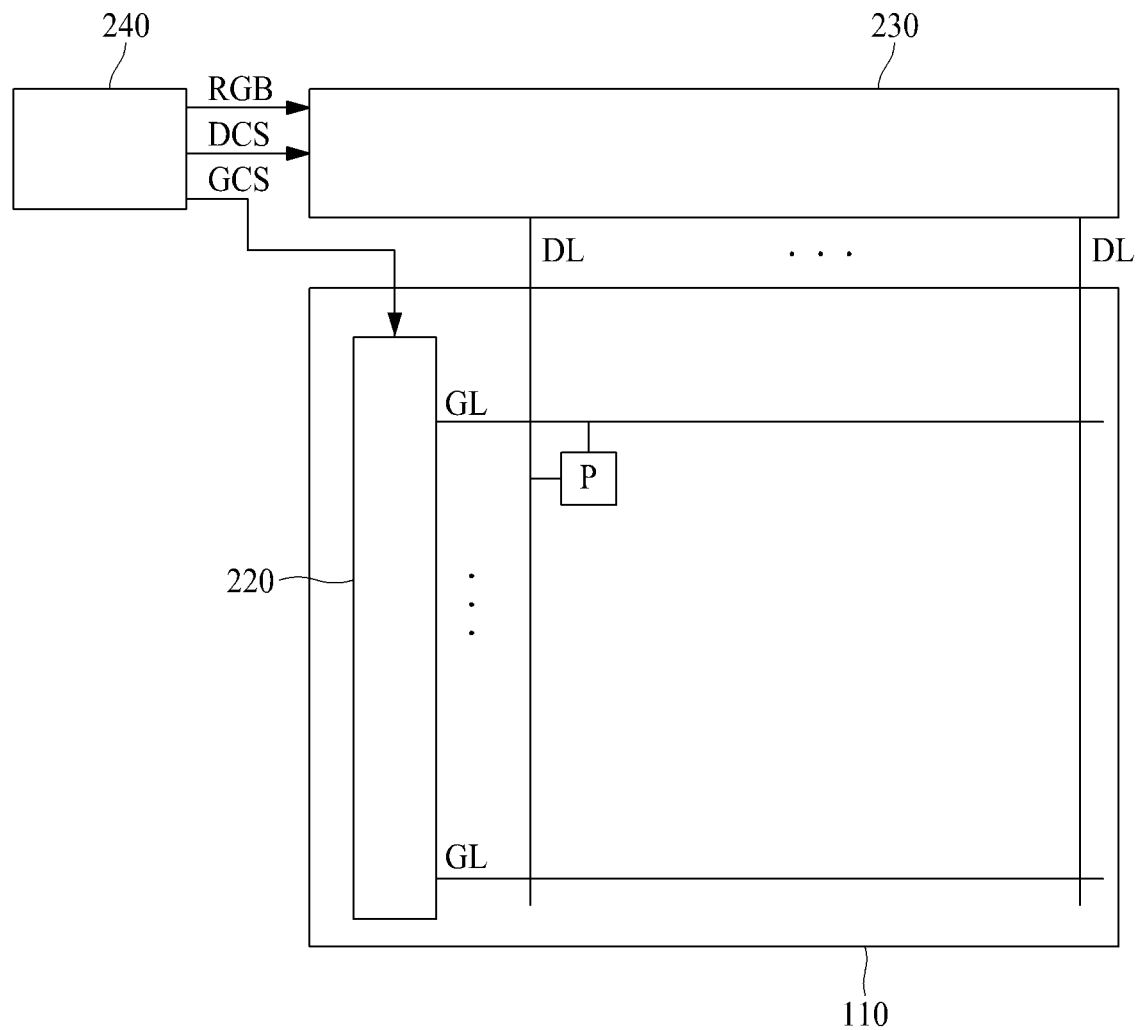
FIG. 9 is a schematic view illustrating a display device according to an embodiment of the present disclosure.

FIG. 9 is a schematic view illustrating the display device 500 according to the embodiment of the present disclosure.

The display device 500 according to this embodiment of the present disclosure can include a plurality of pixels (P's), a gate driver 220, a data driver 230, and a controller 240 on a substrate 110, as shown in FIG. 9.

On the substrate 110, there are gate lines (GL) and data lines (DL) crossing each other, and the pixel (P) is arranged at a crossing portion of the corresponding gate line (GL) and the corresponding data line (DL). Each pixel (P) includes a display element 710, and a pixel driving circuit (PDC) for driving the display element 710. An image is displayed by driving the pixels (P).

The controller 240 controls the gate driver 220 and the data driver 230.

The controller 240 outputs a gate control signal (GCS) for controlling the gate driver 220 and a data control signal (DCS) for controlling the data driver 230 by the use of vertically/horizontally synchronized signal and clock signal supplied from an external system. Also, the controller 240 samples input video data, which is provided from the external system, and then re-aligns the sampled video data, and supplies the re-aligned digital video data (RGB) to the data driver 230.

The gate control signal (GCS) includes a gate start pulse (GSP), a gate shift clock (GSC), a gate output enable signal (GOE), a start signal (Vst), and a gate clock (GCLK). Also, control signals for controlling a shift register can be included in the gate control signal (GCS).

The data control signal (DCS) includes a source start pulse (SSP), a source shift clock signal (SSC), a source output enable signal (SOE), and a polarity control signal (POL).

The data driver 230 supplies a data voltage to the data lines (DL) on the substrate 110. In detail, the data driver 230 converts the video data (RGB) provided from the controller 240 into an analog data voltage, and supplies the analog data voltage to the data lines (DL).

The gate driver 220 sequentially supplies a gate pulse (GP) to the gate lines (GL) for 1 frame period. Herein, '1 frame' indicates a period in which one image is output through the display panel. Also, the gate driver 220 supplies a gate-off signal for turning off the switching device to the gate line (GL) for the remaining period of 1 frame in which the gate pulse (GP) is not supplied. Hereinafter, the gate pulse (GP) and the gate-off signal (Goff) are totally referred to as scan signals (SS).

According to one embodiment of the present disclosure, the gate driver 220 can be provided on a display panel. A structure of directly providing the gate driver 220 on the substrate 110 can be referred to as Gate-In-Panel (GIP) structure. The thin film transistors 100, 200, 300, 301, 400 and 401 (or any variations thereof) according to the embodiments of the present disclosure can be used as the transistor for the gate driver 200.

Figure 10:
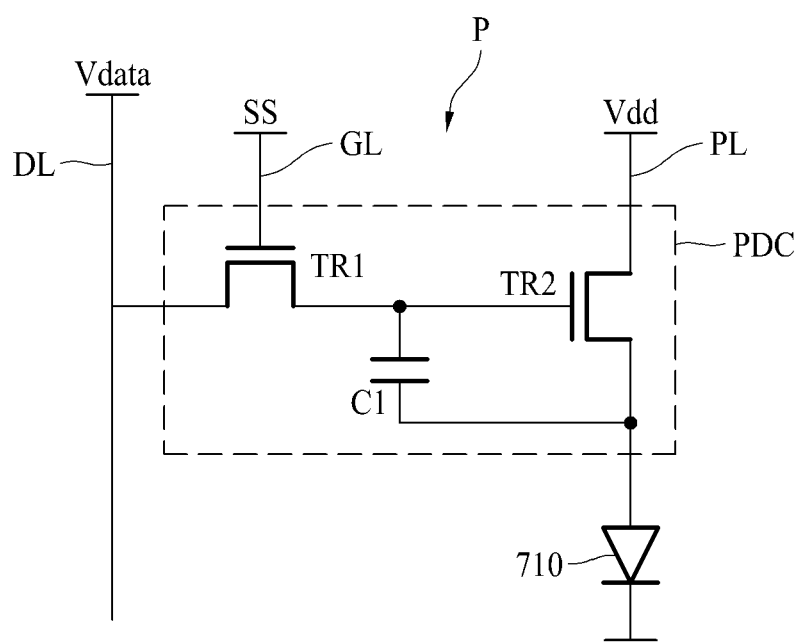
FIG. 10 is a circuit diagram illustrating any one pixel of FIG. 9.
Figure 11:
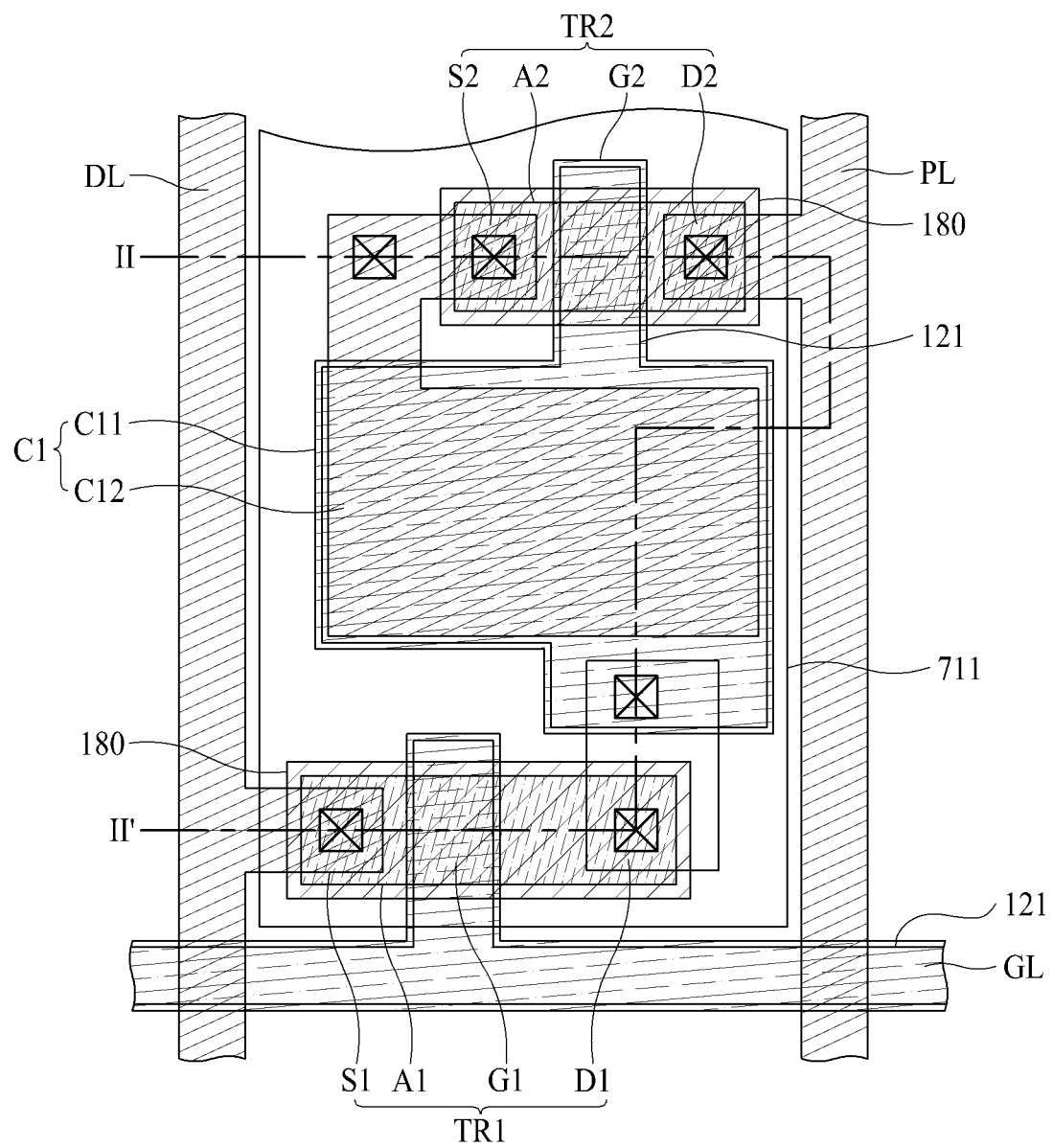
FIG. 11 is a plane view illustrating an example of the pixel of FIG. 10.
Figure 12:
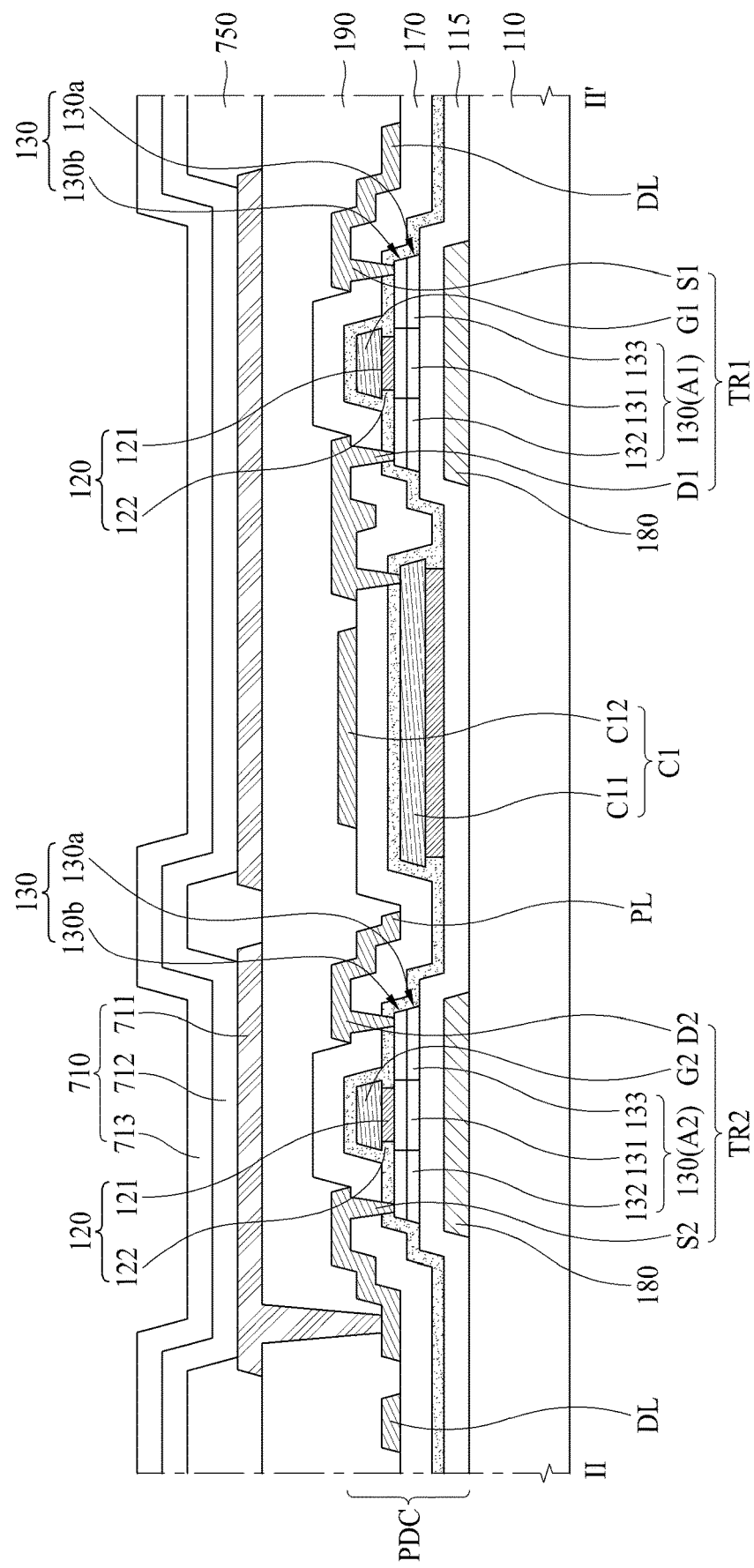
FIG. 12 is a cross sectional view along II-II' of FIG. 11.

FIG. 10 is a circuit diagram illustrating an example of any one pixel (P) of FIG. 9, FIG. 11 is a plane view illustrating the pixel (P) of FIG. 10, and FIG. 12 is a cross sectional view along II-II' of FIG. 11.

The circuit diagram of FIG. 10 corresponds to an equivalent circuit diagram for one pixel (P) in the display device 500 including an organic light emitting diode (OLED). The pixel driving circuit (PDC) of FIG. 10 includes a first thin film transistor (TR1) corresponding to a switching transistor, and a second thin film transistor (TR2) corresponding to a driving transistor.

Each of the thin film transistors 100, 200, 300, 301, 400 and 401 shown in FIGS. 2, 3, 4A, 4B, 5A and 5B and any variations thereof can be used for each of the first thin film transistor (TR1) and the second thin film transistor (TR2). For example, the thin film transistors 100 and 200 shown in FIGS. 2 and 3 can be used as the first thin film transistor (TR1) corresponding to the switching transistor, and the thin film transistors 300 and 400 shown in FIGS. 4A and 5A can be used as the second thin film transistor (TR2) corresponding to the driving transistor. Other variations are possible.

The first thin film transistor (TR1) can be connected with gate and data lines (GL, DL) and can be turned-on or turned-off by a scan signal (SS) supplied through the gate line (GL).

The data line (DL) provides a data voltage (Vdata) to the pixel driving circuit (PDC), and the first thin film transistor (TR1) controls an application of the data voltage (Vdata).

A driving voltage line (PL) provides a driving voltage (Vdd) to a display element 710, and the second thin film transistor (TR2) controls the driving voltage (Vdd). The driving voltage (Vdd) corresponds to a pixel driving voltage for driving the organic light emitting diode (OLED) corresponding to the display element 710.

When the first thin film transistor (TR1) is turned-on by the scan signal (SS) applied from a gate driver 220 via the gate line (GL), the data voltage (Vdata) supplied via the data line (DL) is supplied to a gate electrode (G2) of the second thin film transistor (TR2) connected with the display element 710. The data voltage (Vdata) is charged in a first capacitor (C1) provided between the gate electrode (G2) of the second thin film transistor (TR2) and a source electrode (S2) of the second thin film transistor (TR2). The first capacitor (C1) corresponds to a storage capacitor (Cst). The first capacitor (C1) includes a first capacitor electrode (C11) connected with the gate electrode (G2) of the second thin film transistor (TR2), and a second capacitor electrode (C12) connected with the source electrode (S2) of the second thin film transistor (TR2).

A supply amount of current supplied to the organic light emitting diode (OLED) corresponding to the display element 710 through the second thin film transistor (TR2) is controlled in accordance with the data voltage (Vdata), whereby it is possible to control a grayscale of the light emitted from the display element 710.

Referring to FIGS. 11 and 12, the pixel driving circuit (PDC) is disposed on a substrate 110.

The substrate 110 can be formed of glass or plastic.

The pixel driving circuit (PDC) includes a light shielding layer 180 on the substrate 110, a buffer layer 115 (optional) on the light shielding layer 180, an active layer (A1, A2) 130 on the buffer layer 115, a gate electrode (G1, G2) partially overlapped with the active layer (A1, A2) 130, and a source electrode (S1, S2) and a drain electrode (D1, D2) connected with the active layer (A1, A2) 130.

The light shielding layer 180 is formed of an electrical conductive material such as metal. The light shielding layer 180 blocks externally-provided incident light, to thereby protect the active layer 130.

The buffer layer 115 is disposed on the light shielding layer 180. The buffer layer 115 is formed of an insulating material, and is configured to protect the active layer 130 from externally-provided moisture or oxygen.

A first active layer (A1) of the first thin film transistor (TR1) and a second active layer (A2) of the second thin film transistor (TR2) are disposed on the buffer layer 115.

Referring to FIG. 12, the first active layer (A1) of the first thin film transistor (TR1) and the second active layer (A2) of the second thin film transistor (TR2) include a first oxide semiconductor layer 130a, and a second oxide semiconductor layer 130b on the first oxide semiconductor layer 130a. However, one embodiment of the present disclosure is not limited to the above. Any one of the first active layer (A1) and the second active layer (A2) can include the first oxide semiconductor layer 130a and the second oxide semiconductor layer 130b sequentially provided, and both the first active layer (A1) and the second active layer (A2) can include an oxide semiconductor layer of a single-layered type.

A gate insulating layer 120 is disposed on the active layer 130. In detail, a first gate insulating layer 121 is firstly disposed on the active layer 130. Also, at least a part of a second gate insulating layer 122 can be disposed on the active layer 130.

The gate electrode (G1, G2) is disposed on the first gate insulating layer 121. The gate electrode (G1, G2) can be an area extended from the gate line (GL), or can be a part of the gate line (GL).

The second gate insulating layer 122 is disposed on the gate electrode (G1, G2). The first gate insulating layer 121 and the second gate insulating layer 122 have the different dielectric constants (k) from each other. The first gate insulating layer 121 and the second gate insulating layer 122 constitute the gate insulating layer 120.

For example, the second gate insulating layer 122 can have the dielectric constant (k) which is higher than that of the first gate insulating layer 121. However, another embodiment of the present disclosure is not limited to the above. For instance, the second gate insulating layer 123 can have the low-k material whose dielectric constant (k) is relatively lower than that of the first gate insulating layer 121.

An insulating interlayer 170 is disposed on the second gate insulating layer 122.

The source electrode (S1, S2) and the drain electrode (D1, D2) are disposed on the insulating interlayer 170. According to one embodiment of the present disclosure, for convenience of explanation, the source electrode (S1, S2) and the drain electrode (D1, D2) are distinguished from each other, however, the source electrode (S1, S2) and the drain electrode (D1, D2) are used interchangeably. Thus, the source electrode (S1, S2) can be the drain electrode (D1, D2), and the drain electrode (D1, D2) can be the source electrode (S1, S2).

According to one embodiment of the present disclosure, the source electrode (S1) and the drain electrode (D1) included in the first thin film transistor (TR1) are spaced apart from each other, and are connected with the first active layer (A1) of the first thin film transistor (TR1). The source electrode (S2) and the drain electrode (D2) included in the second thin film transistor (TR2) are spaced apart from each other, and are connected with the second active layer (A2) of the second thin film transistor (TR2).

Also, the data line (DL) and the driving power line (PL) are disposed on the insulating interlayer 170. According to one embodiment of the present disclosure, the source electrode (S1) of the first thin film transistor (TR1) is connected with the data line (DL). The drain electrode (D2) of the second thin film transistor (TR2) is connected with the driving power line (PL).

A planarization layer 190 is disposed on the source electrode (S1, S2), the drain electrode (D1, D2), the data line (DL), and the driving power line (PL). The planarization layer 190 is configured to planarize an upper surface of the first thin film transistor (TR1) and an upper surface of the second thin film transistor (TR2), and also to protect the first thin film transistor (TR1) and the second thin film transistor (TR2).

A first electrode 711 of the display element 710 is disposed on the planarization layer 190. The first electrode 711 of the display element 710 can be connected with the source electrode (S2) of the second thin film transistor (TR2) via a contact hole provided in the planarization layer 190.

A bank layer 750 is disposed in the edge of the first electrode 711. The bank layer 750 defines an emission area of the display element 710.

An organic emission layer 712 is disposed on the first electrode 711, and a second electrode 713 is disposed on the organic emission layer 712, whereby the display element 710 is completed. The display element 710 shown in FIG. 12 corresponds to the organic light emitting diode (OLED). Accordingly, the display device 500 according to one embodiment of the present disclosure corresponds to the organic light emitting display device.

Figure 13:
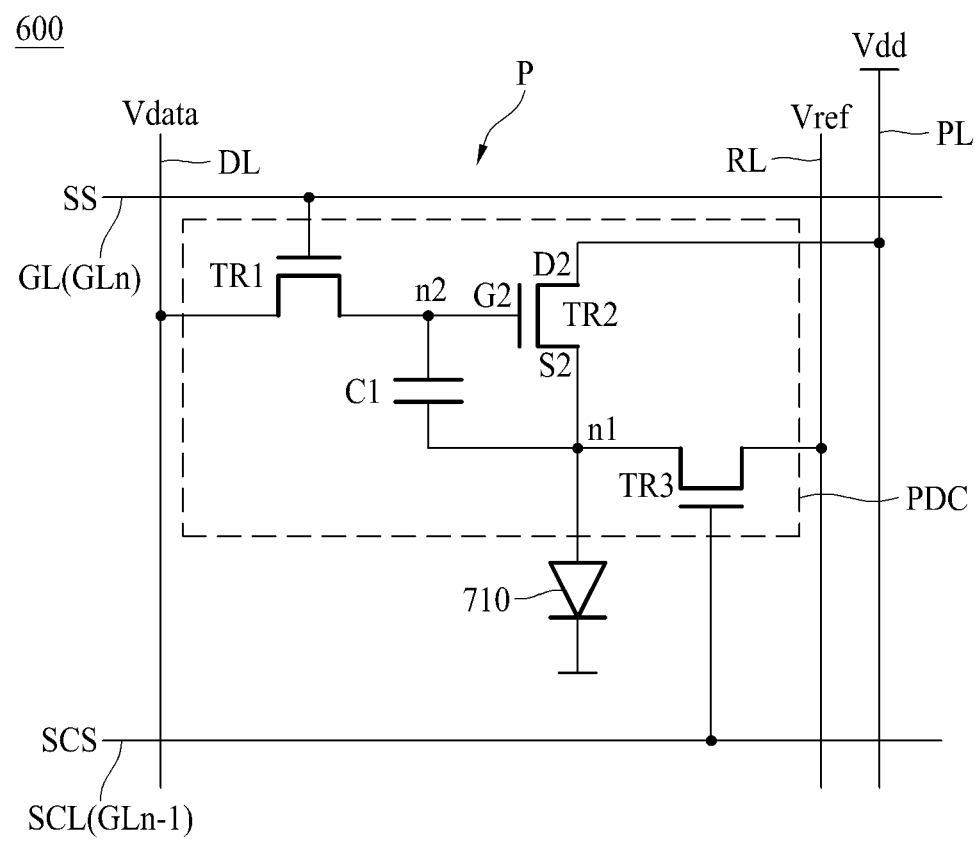
FIG. 13 is a circuit diagram illustrating a pixel of a display device according to another embodiment of the present disclosure.

FIG. 13 is a circuit diagram illustrating any one pixel (P) of a display device 600 according to another embodiment of the present disclosure. FIG. 13 is an equivalent circuit diagram for a pixel (P) of an organic light emitting display device.

The pixel (P) of the display device 600 shown in FIG. 13 includes an organic light emitting diode (OLED) corresponding to a display element 710, and a pixel driving circuit (PDC) for driving the display element 710. The display element 710 is connected with the pixel driving circuit (PDC).

In the pixel (P), there are signal lines (DL, GL, PL, RL, SCL) for supplying a signal to the pixel driving circuit (PDC).

A data voltage (Vdata) is supplied to a data line (DL), a scan signal (SS) is supplied to a gate line (GL), a driving voltage (VDD) for driving the pixel is supplied to a driving voltage line (PL), a reference voltage (Vref) is supplied to a reference line (RL), and a sensing control signal (SCS) is supplied to a sensing control line (SCL).

Referring to FIG. 13, when the gate line of the (n)th pixel (P) is referred to as "GLn", the gate line of the neighboring (n-1)th pixel (P) is "GLn-1", and the gate line of the (n-1)th pixel (P) serves as the sensing control line (SCL) of the (n)th pixel (P). Here, n is a natural number, e.g., positive integer.

The pixel driving circuit (PDC) includes a first thin film transistor (TR1, switching transistor) connected with the gate line (GL) and the data line (DL), a second thin film transistor (TR2, driving transistor) configured to control a level of current which is provided to the display element 710 in accordance with the data voltage (Vdata) transmitted through the first thin film transistor (TR1), and a third thin film transistor (TR3, reference transistor) configured to sense the properties of the second thin film transistor (TR2).

The first thin film transistor (TR1) is turned-on by the scan signal (SS) supplied to the gate line (GL), and the first thin film transistor (TR1) transmits the data voltage (Vdata), which is supplied to the data line (DL), to a gate electrode (G2) of the second thin film transistor (TR2).

The third thin film transistor (TR3) is connected with the reference line (RL) and a first node (n1) between the display element 710 and the second thin film transistor (TR2). The third thin film transistor (TR3) is turned-on or turned-off by the sensing control signal (SCS), and the third thin film transistor (TR3) senses the properties of the second thin film transistor (TR2) corresponding the driving transistor for a sensing period.

A second node (n2) connected with the gate electrode (G2) of the second thin film transistor (TR2) is connected with the first thin film transistor (TR1). A first capacitor (C1) is formed between the second node (n2) and the first node (n1). The first capacitor (C1) is referred to as a storage capacitor (Cst).

When the first thin film transistor (TR1) is turned-on, the data voltage (Vdata) supplied through the data line (DL) is supplied to the gate electrode (G2) of the second thin film transistor (TR2). The first capacitor (C1) formed between a source electrode (S2) and the gate electrode (G2) of the second thin film transistor (TR2) is charged with the data voltage (Vdata).

When the second thin film transistor (TR2) is turned-on, a current is supplied to the display element 710 through the second thin film transistor (TR2) by the driving voltage (Vdd) for driving the pixel, whereby light is emitted from the display element 710.

The first thin film transistor (TR1), the second thin film transistor (TR2), and the third thin film transistor (TR3) shown in FIG. 13 can be identical in structure to any one among the thin film transistors 100, 200, 300, 301, 400 and 401 shown in FIGS. 2, 3, 4A, 4B, 5A and 5B and any variations thereof.

Figure 14:
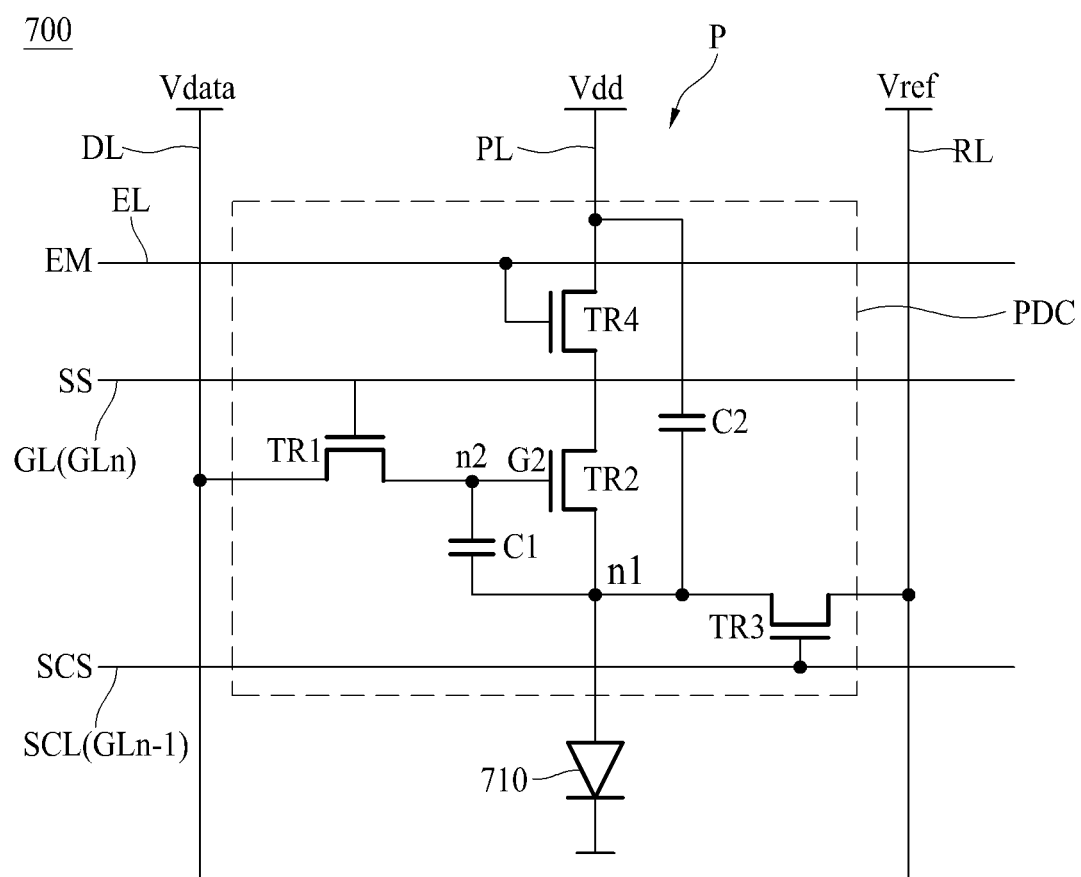
FIG. 14 is a circuit diagram illustrating a pixel of a display device according to another embodiment of the present disclosure.

FIG. 14 is a circuit diagram illustrating a pixel of a display device 700 according to another embodiment of the present disclosure.

The pixel (P) of the display device 700 shown in FIG. 14 includes an organic light emitting diode (OLED) corresponding to a display element 710, and a pixel driving circuit (PDC) for driving the display element 710. The display element 710 is connected with the pixel driving circuit (PDC).

The pixel driving circuit (PDC) includes thin film transistors (TR1, TR2, TR3, TR4).

In the pixel (P), there are signal lines (DL, EL, GL, PL, SCL, RL) for supplying a signal to the pixel driving circuit (PDC).

In comparison to the pixel (P) of FIG. 13, the pixel (P) of FIG. 14 further includes an emission control line (EL). An emission control signal (EM) is supplied to the emission control line (EL).

Also, in comparison to the pixel driving circuit (PDC) of FIG. 13, the pixel driving circuit (PDC) of FIG. 14 further includes a fourth thin film transistor (TR4) corresponding to an emission control transistor configured to control an emission time point of the second thin film transistor (TR2).

Referring to FIG. 14, when the gate line of the (n)th pixel (P) is referred to as "GLn", the gate line of the neighboring (n-1)th pixel (P) is "GLn-1", and the gate line of the (n-1)th pixel (P) serves as the sensing control line (SCL) of the (n)th pixel (P). Here, n is a natural number, e.g., positive integer.

A first capacitor (C1) is positioned between the display element 710 and a gate electrode (G2) of the second thin film transistor (TR2). Also, a second capacitor (C2) is positioned between one electrode of the display element 710 and a terminal supplied with a driving voltage (Vdd) among a plurality of terminals.

The first thin film transistor (TR1) is turned-on by the scan signal (SS) supplied to the gate line (GL), and the first thin film transistor (TR1) transmits the data voltage (Vdata), which is supplied to the data line (DL), to the gate electrode (G2) of the second thin film transistor (TR2).

The third thin film transistor (TR3) is connected with the reference line (RL), and is turned-on or turned-off by the sensing control signal (SCS), and the third thin film transistor (TR3) senses the properties of the second thin film transistor (TR2) corresponding to the driving transistor for a sensing period.

The fourth thin film transistor (TR4) transmits the driving voltage (Vdd) to the second thin film transistor (TR2) or blocks the driving voltage (Vdd) in accordance with the emission control signal (EM). When the fourth thin film transistor (TR4) is turned-on, a current is supplied to the second thin film transistor (TR2), whereby light is emitted from the display element 710.

The first thin film transistor (TR1), the second thin film transistor (TR2), the third thin film transistor (TR3) and the fourth thin film transistor (TR4) shown in FIG. 14 can be identical in structure to any one among the thin film transistors 100, 200, 300, 301, 400 and 401 shown in FIGS. 2, 3, 4A, 4B, 5A and 5B and any variations thereof.

The pixel driving circuit (PDC) according to the embodiments of the present disclosure can be formed in various structures in addition to the above-described structures. For example, the pixel driving circuit (PDC) can include five or more thin film transistors.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A thin film transistor comprising:
    an active layer on a substrate;
    a gate electrode configured to be spaced from the active layer and partially overlapped with the active layer; and
    a gate insulating layer, at least a part of the gate insulating layer being disposed between the active layer and the gate electrode,
    wherein the gate insulating layer includes:
        a first gate insulating layer between the active layer and the gate electrode; and
        a second gate insulating layer configured to have a dielectric constant (k) which is different from a dielectric constant of the first gate insulating layer, and disposed in a same layer as the first gate insulating layer,
    wherein at least a part of the second gate insulating layer is disposed between the active layer and the gate electrode,
    wherein a lateral surface of the first gate insulating layer is in contact with a lateral surface of the second gate insulating layer,
    wherein the second gate insulating layer has the dielectric constant (k) which is lower than that of the first gate insulating layer, and
    wherein the second gate insulating layer includes at least one of strontium oxide ($SrO_2$) and lanthanum oxide ($La_2O_3$).

2. The thin film transistor according to claim 1, wherein from a top plan view, the second gate insulating layer completely surrounds the first gate insulating layer.

3. The thin film transistor according to claim 1, wherein from a top plan view, the first gate insulating layer is disposed inside an area defined by the gate electrode.

4. The thin film transistor according to claim 1, wherein at least a part of the second gate insulating layer extends to a lateral surface and an upper surface of the gate electrode.

5. The thin film transistor according to claim 1, wherein the active layer includes a channel portion overlapped with the gate electrode, and at least a part of the first gate insulating layer and at least a part of the second gate insulating layer are disposed on the channel portion of the active layer.

6. The thin film transistor according to claim 1, wherein the active layer includes:
    a first oxide semiconductor layer; and
    a second oxide semiconductor layer on the first oxide semiconductor layer.

7. The thin film transistor according to claim 1, wherein the second gate insulating layer includes a pore.

8. The thin film transistor according to claim 7, wherein the pore of the second gate insulating layer is disposed between the active layer and the gate electrode.

9. The thin film transistor according to claim 1, wherein the second gate insulating layer includes an interface.

10. The thin film transistor according to claim 9, wherein the interface of the second gate insulating layer is disposed between the active layer and the gate electrode.

11. A display device comprising:
    at least one pixel driving circuit on a substrate; and
    a display element electrically connected with each of the at least one pixel driving circuit, and used to display an image,
    wherein each pixel driving circuit includes at least one thin film transistor,
    wherein each thin film transistor includes:
        an active layer on the substrate;
        a gate electrode configured to be spaced from the active layer and partially overlapped with the active layer; and
        a gate insulating layer, at least a part of the gate insulating layer being disposed between the active layer and the gate electrode,
    wherein for each of the at least one thin film transistor the gate insulating layer includes:
        a first gate insulating layer between the active layer and the gate electrode; and
        a second gate insulating layer configured to have a dielectric constant (k) which is different from a dielectric constant of the first gate insulating layer, the second gate insulating layer disposed in a same layer as the first gate insulating layer, and provided to surround the first gate insulating layer,
    wherein at least a part of the second gate insulating layer is disposed between the active layer and the gate electrode,
    wherein the second gate insulating layer has the dielectric constant (k) which is lower than that of the first gate insulating layer, and
    wherein the second gate insulating layer includes at least one of strontium oxide ($SrO_2$) and lanthanum oxide ($La_2O_3$).

12. The display device according to claim 11, wherein at least a part of the second gate insulating layer extends to a lateral surface and an upper surface of the gate electrode.

13. The display device according to claim 11, wherein the active layer includes a channel portion overlapped with the gate electrode, and at least a part of the first gate insulating layer and at least a part of the second gate insulating layer are disposed on the channel portion of the active layer.

* * * * *